United States Patent
Satoh et al.

(10) Patent No.: US 9,519,016 B2
(45) Date of Patent: Dec. 13, 2016

(54) GROUND FAULT DETECTION APPARATUS

(71) Applicant: Sharp Kabushiki Kaisha, Osaka-shi, Osaka (JP)

(72) Inventors: Katsuhiko Satoh, Osaka (JP); Ryohji Matsui, Osaka (JP); Hiroshi Kawamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 228 days.

(21) Appl. No.: 14/299,081

(22) Filed: Jun. 9, 2014

(65) Prior Publication Data

US 2014/0361784 A1 Dec. 11, 2014

(30) Foreign Application Priority Data

Jun. 11, 2013 (JP) ................................. 2013-122619

(51) Int. Cl.
*G01R 31/02* (2006.01)
*G01R 31/08* (2006.01)
*G01R 31/40* (2014.01)
*G01R 31/42* (2006.01)

(52) U.S. Cl.
CPC ........... *G01R 31/025* (2013.01); *G01R 31/086* (2013.01); *G01R 31/40* (2013.01); *G01R 31/42* (2013.01)

(58) Field of Classification Search
CPC ..... G01R 31/025; G01R 31/08; G01R 31/086; G01R 31/40; G01R 31/42; H02H 1/0092; H02H 3/16; H02M 1/32; B60L 3/0069
USPC ................ 324/500, 509, 512, 528, 531, 555
See application file for complete search history.

(56) References Cited

U.S. PATENT DOCUMENTS

| | | | | |
|---|---|---|---|---|
| 3,585,452 A | * | 6/1971 | Goodwin | H02H 3/347 361/44 |
| 3,978,465 A | * | 8/1976 | Goode | G01R 27/18 324/510 |
| 5,530,363 A | * | 6/1996 | Gaughan | G01R 31/025 324/117 H |
| 7,049,825 B2 | * | 5/2006 | Carruthers | G01R 27/18 324/509 |
| 8,085,517 B2 | * | 12/2011 | Weems, II | G01R 31/025 324/528 |
| 9,075,098 B2 | * | 7/2015 | Schurman | G01R 31/025 |
| 2005/0036249 A1 | * | 2/2005 | Harvey | G01R 31/025 361/42 |

(Continued)

FOREIGN PATENT DOCUMENTS

JP 2012-122986 A 6/2012

*Primary Examiner* — Hoai-An D Nguyen
(74) *Attorney, Agent, or Firm* — Keating & Bennett, LLP

(57) ABSTRACT

A ground fault detection apparatus is an apparatus detecting a ground fault in an ungrounded AC circuit in which a single-phase three-wire AC power source is connected to a load via a U phase wire, a neutral wire, and a V phase wire, including two resistive elements having an identical resistance value, one terminals of the two resistive elements being connected to the U phase wire and the neutral wire, respectively, the other terminals thereof being connected to each other. The ground fault detection apparatus further includes a current detector detecting a value of a current flowing between the other terminals of the two resistive elements (i.e., a node N1) and a ground point. In a case where the absolute value of the current exceeds a threshold value, the ground fault detection apparatus determines that a ground fault occurs.

6 Claims, 23 Drawing Sheets

(56) References Cited

U.S. PATENT DOCUMENTS

2015/0226780 A1* 8/2015 Sun ..................... G01R 31/088
702/59

* cited by examiner

FIG.2
(a)
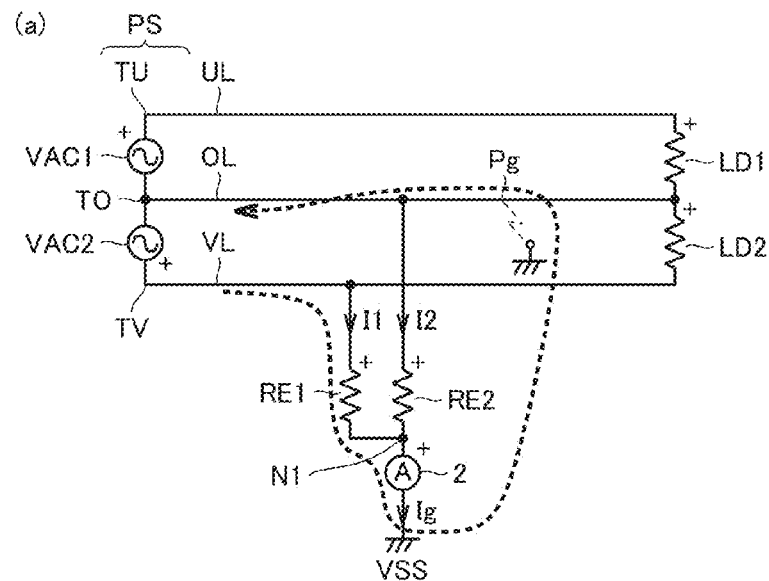
(b) GROUND FAULT OCCURS IN NEUTRAL PHASE
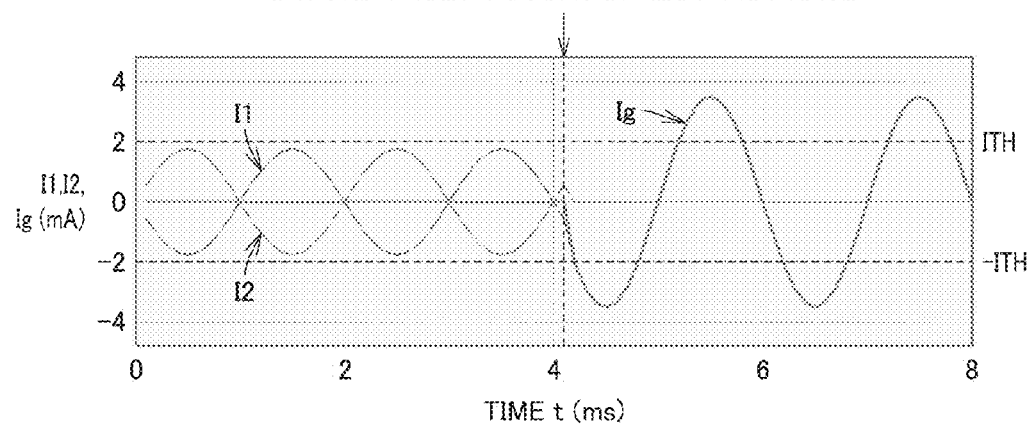

FIG.4
(a)
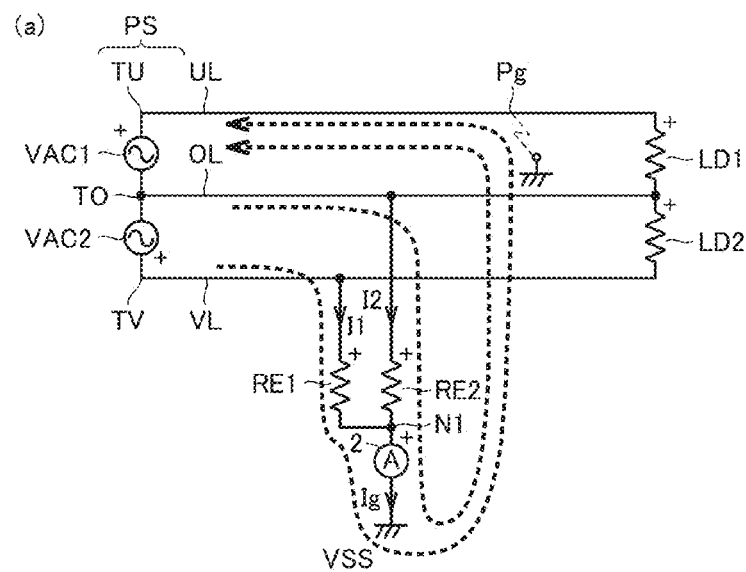
(b)
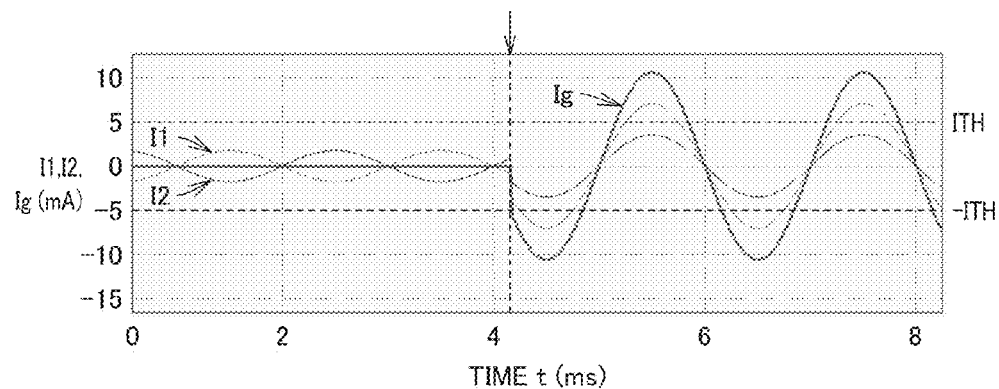

FIG.6
(a)
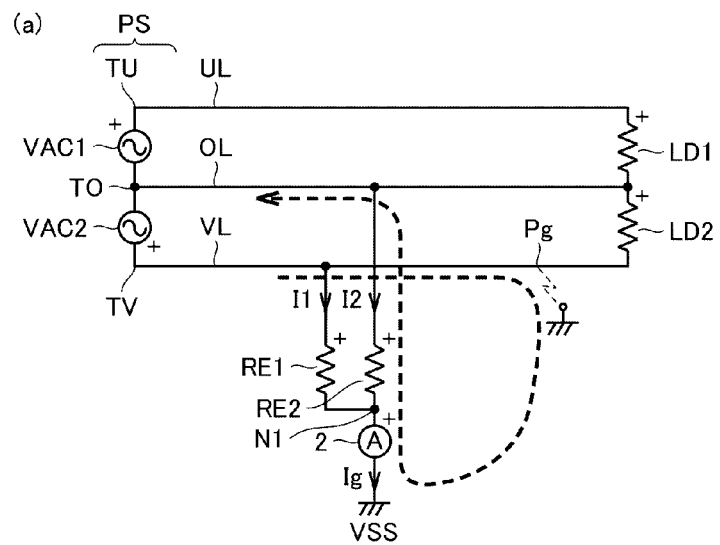
(b)
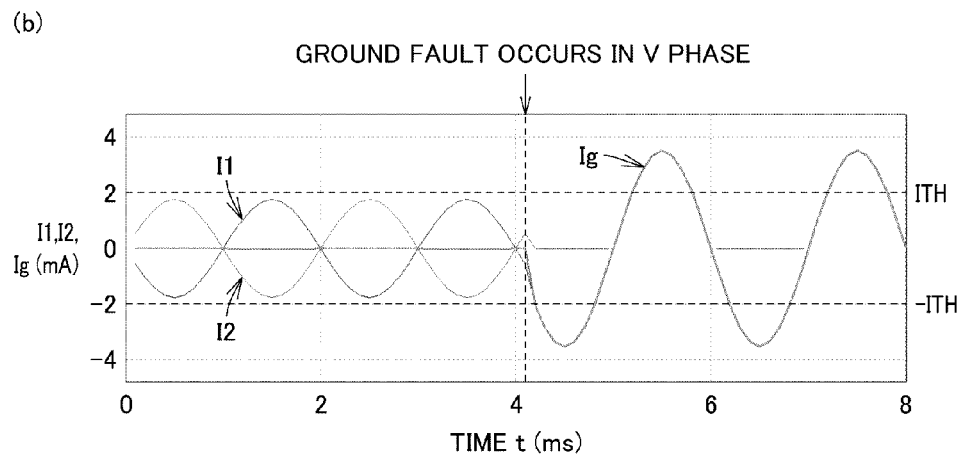
GROUND FAULT OCCURS IN V PHASE

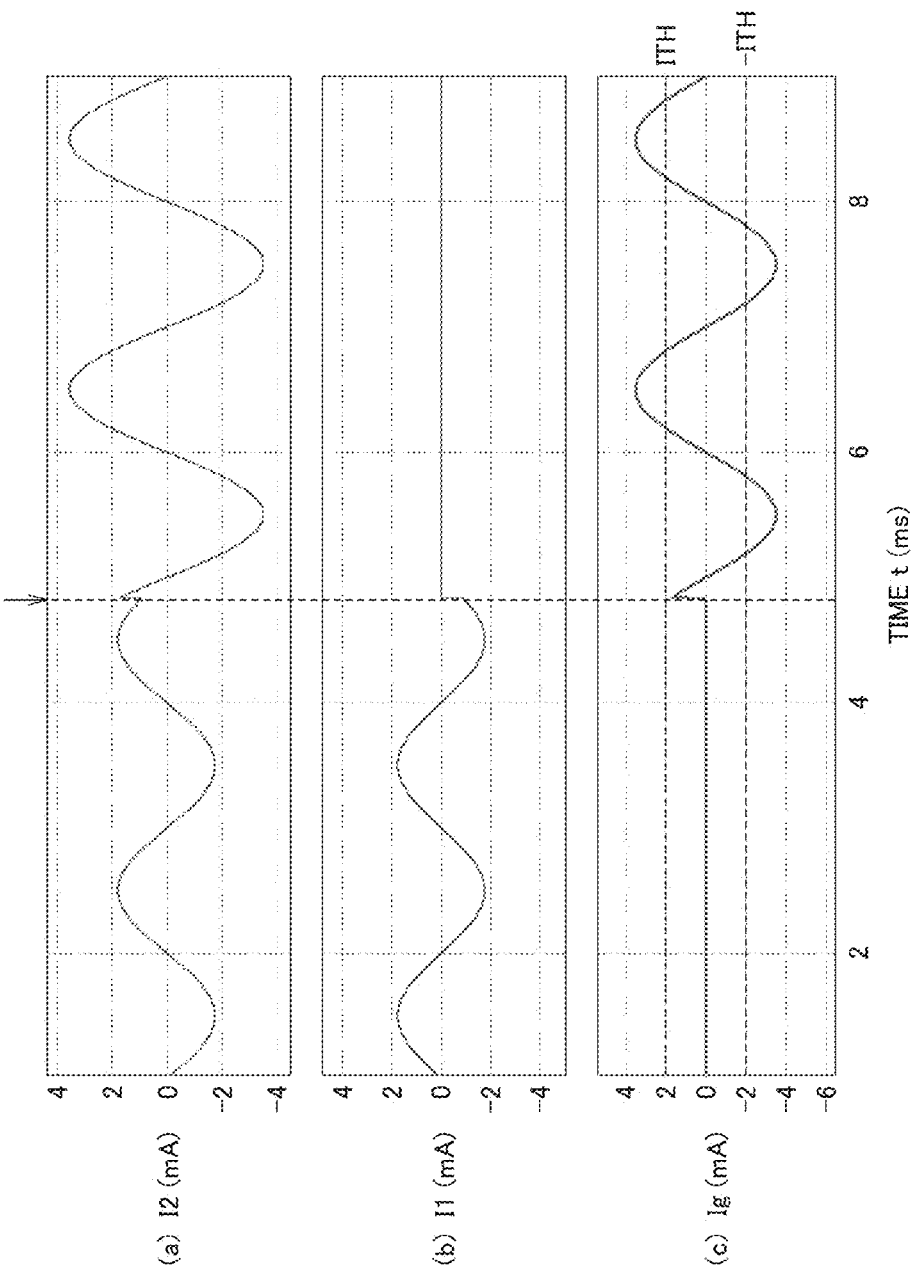

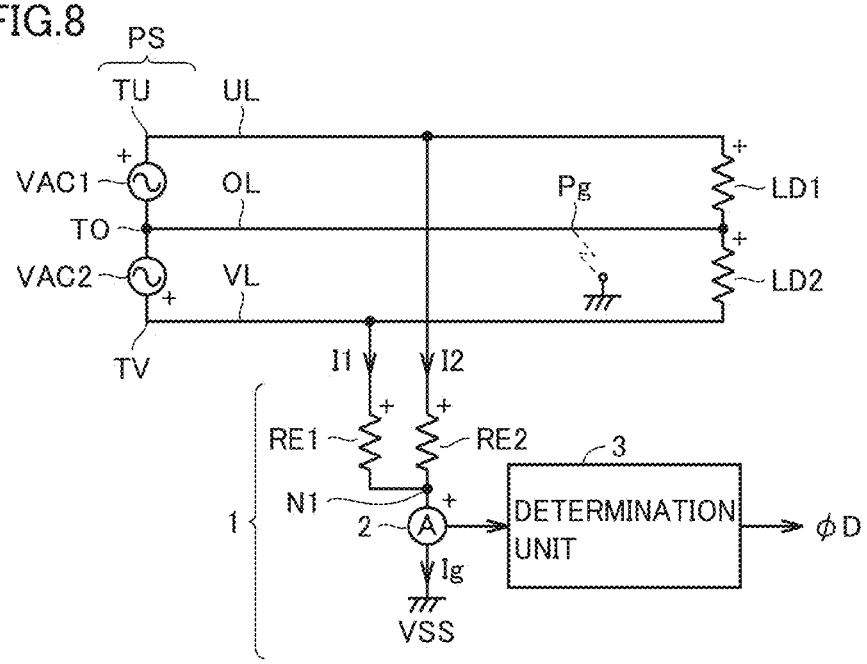
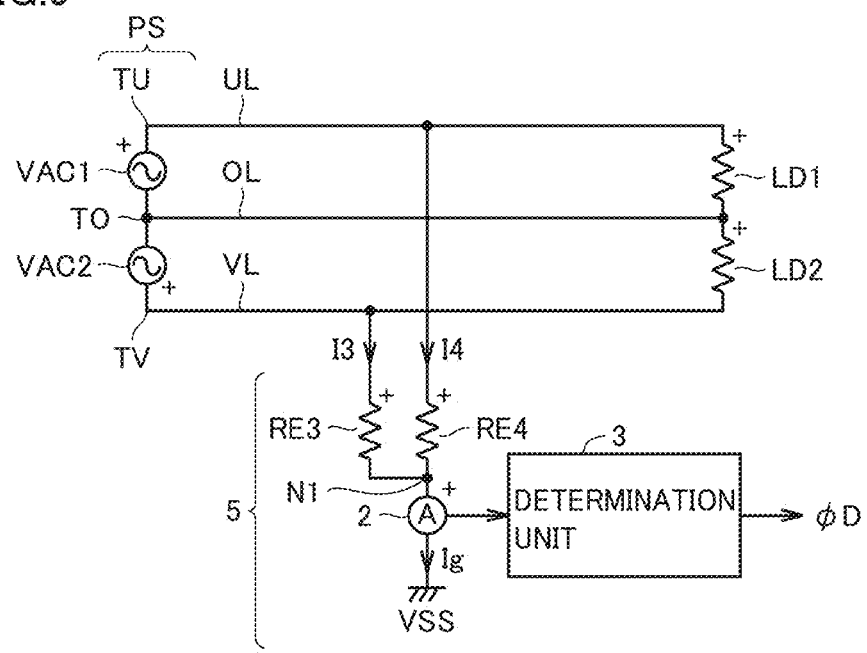

FIG.10
(a)
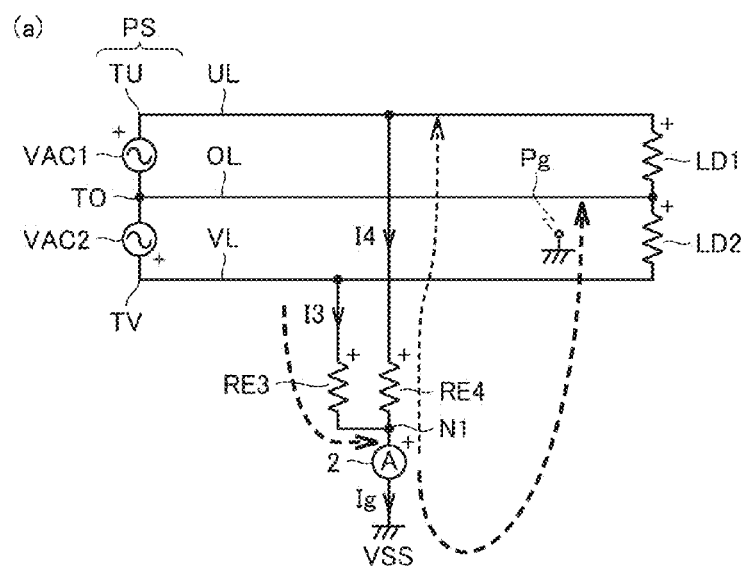
(b)
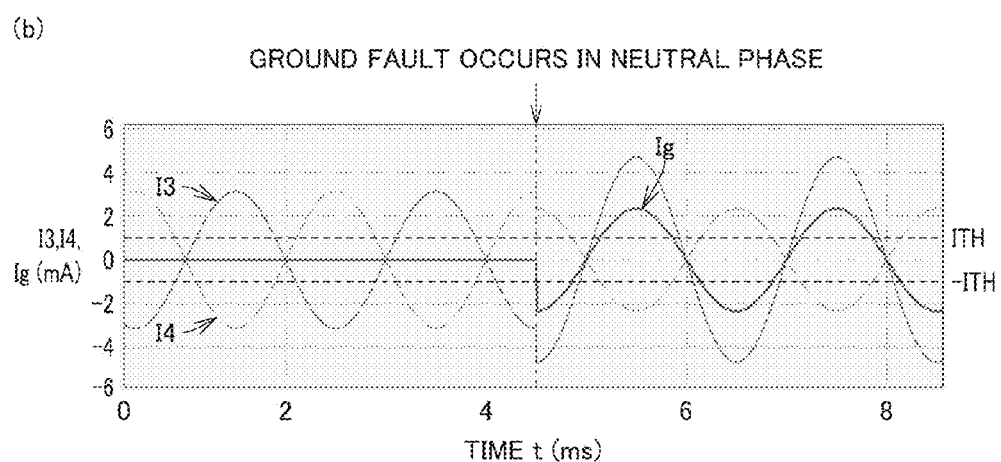

FIG.12
(a)
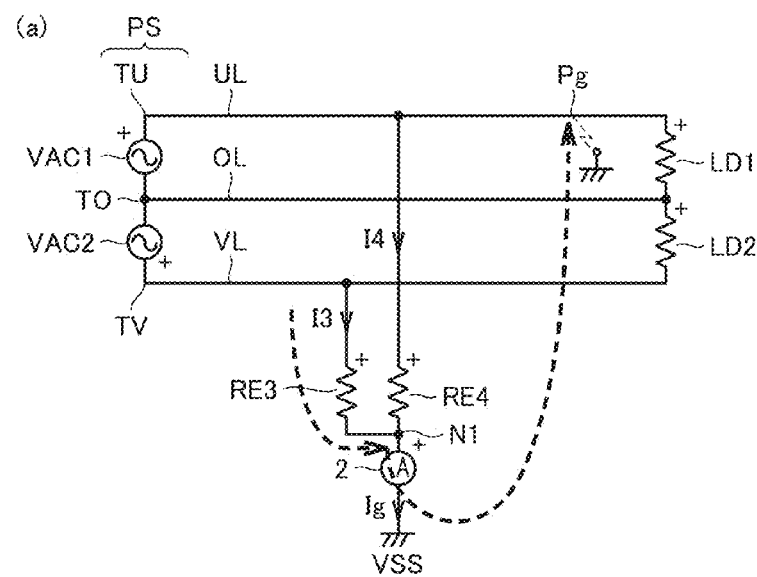
(b)
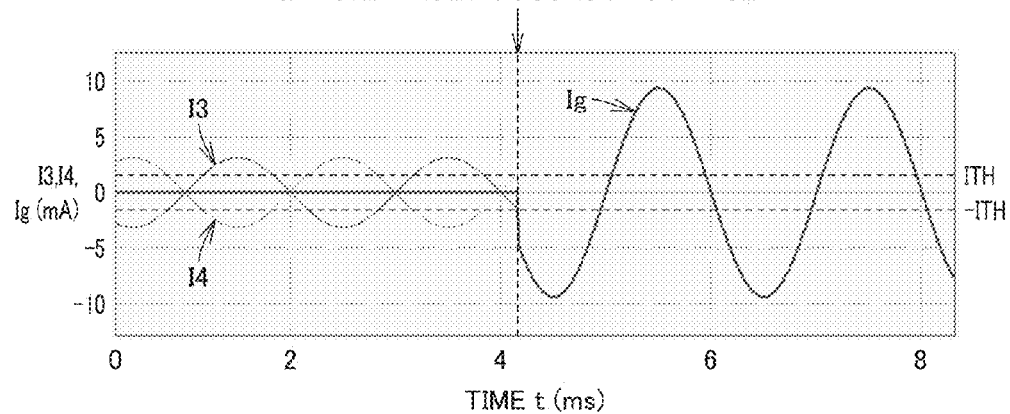

FIG.14
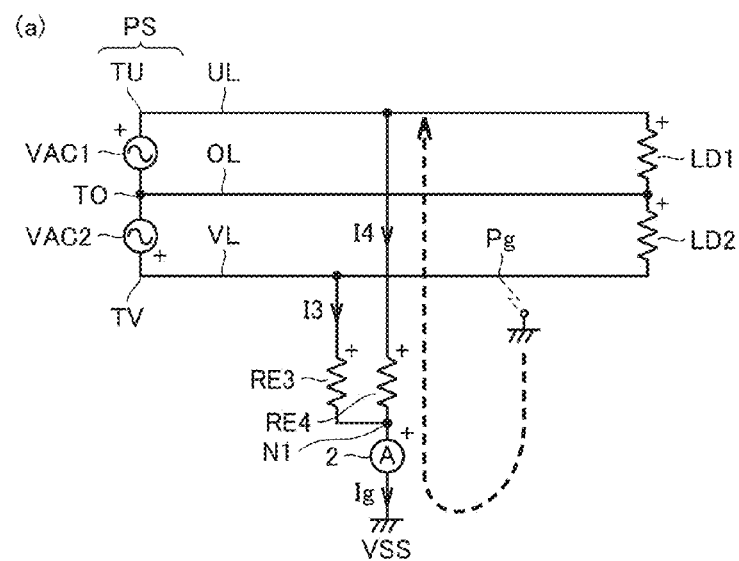
(a)
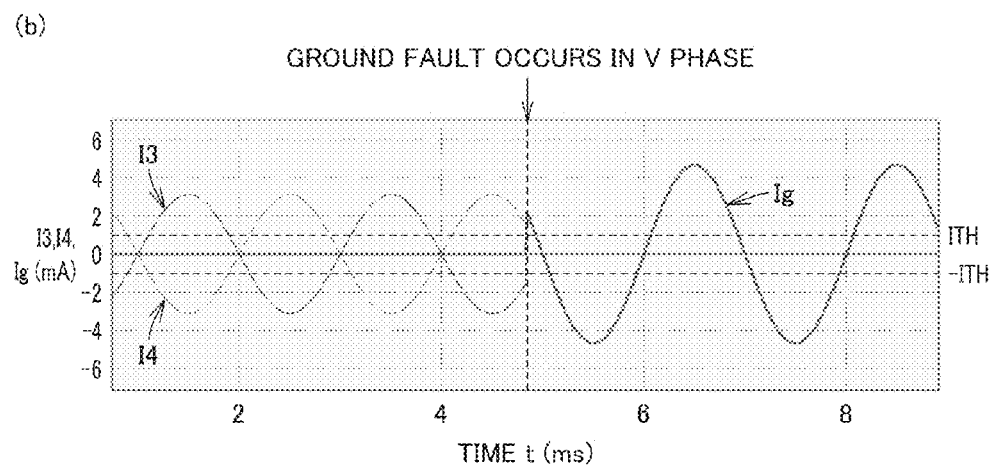
(b) GROUND FAULT OCCURS IN V PHASE

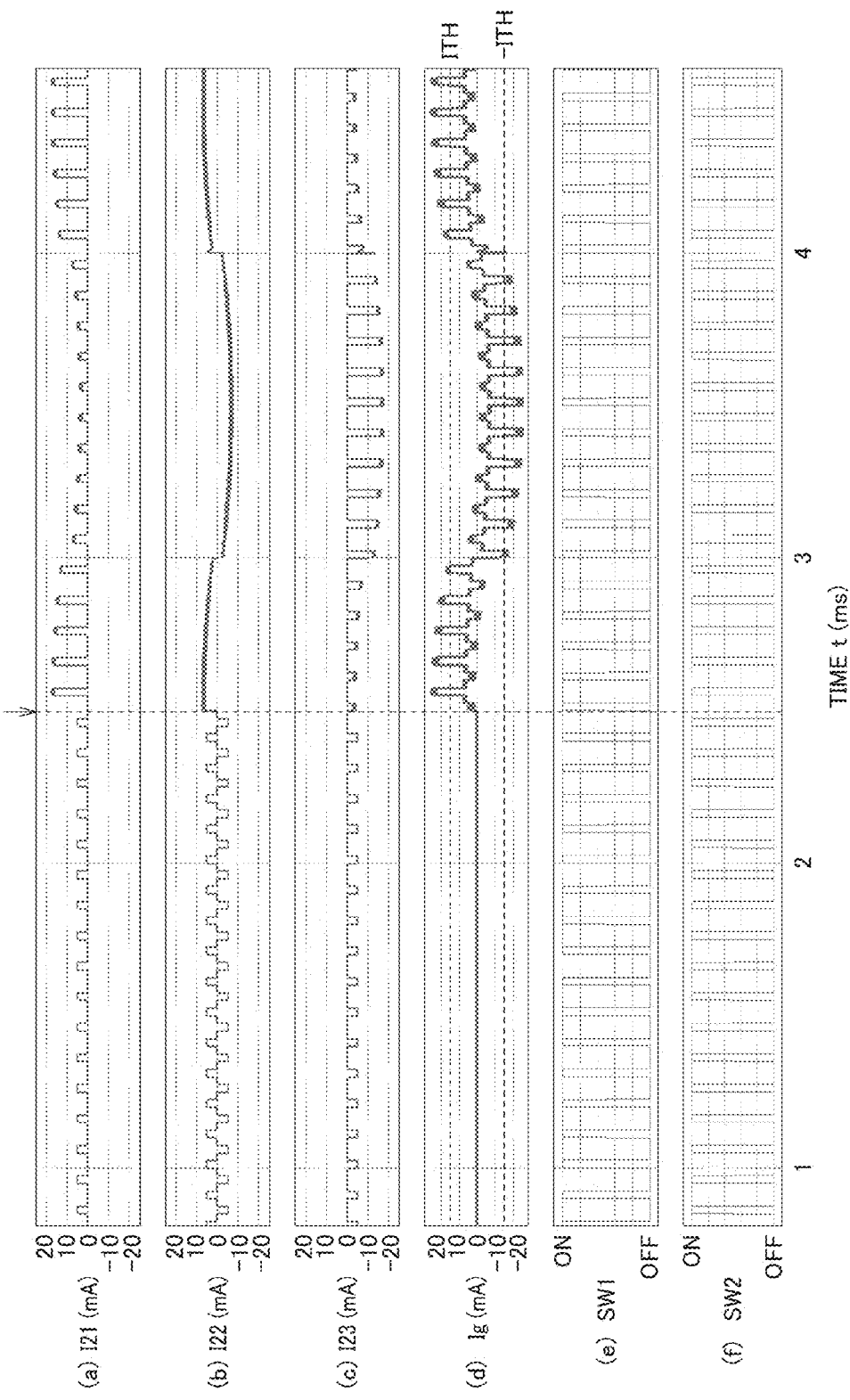

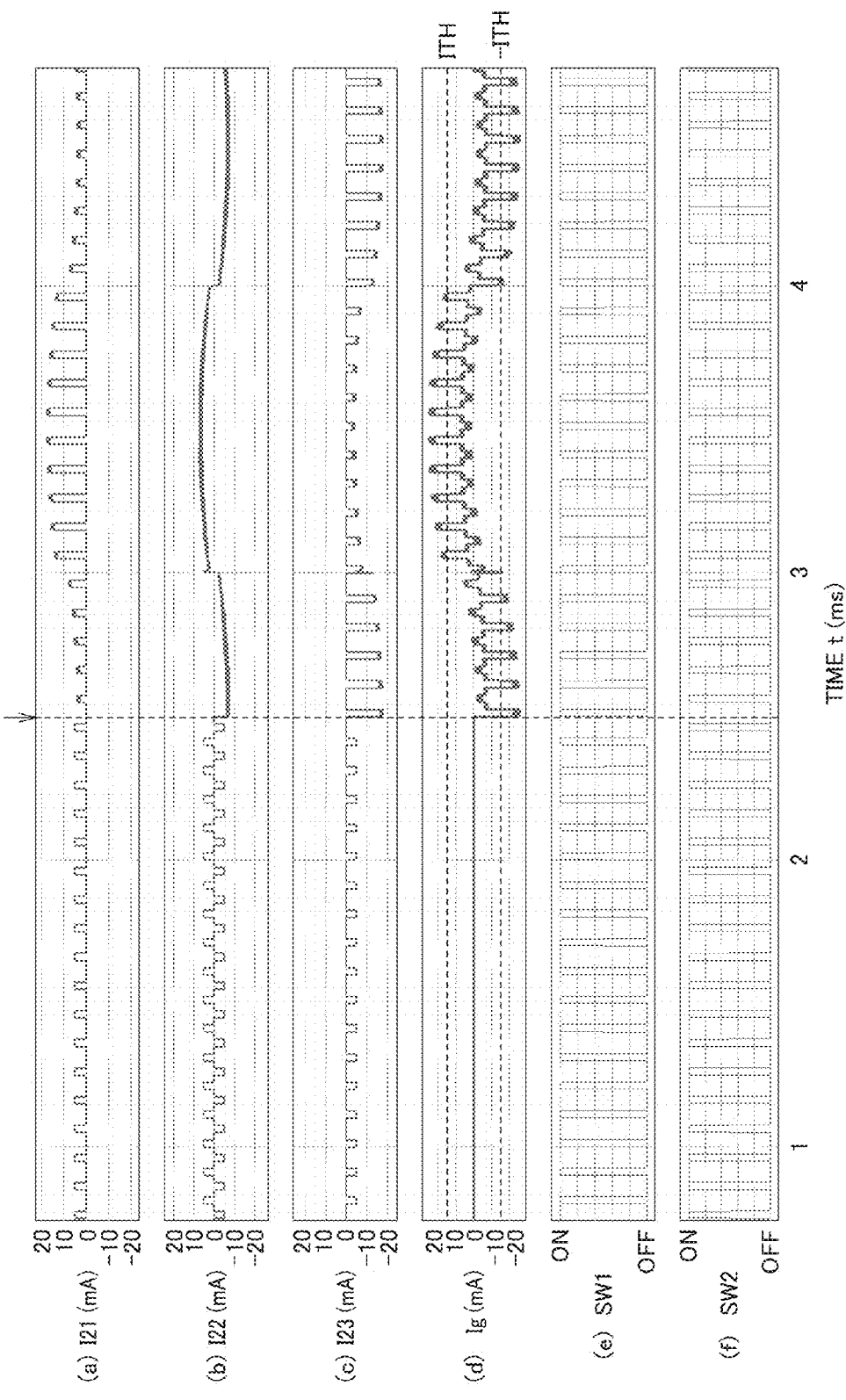

US 9,519,016 B2

GROUND FAULT DETECTION APPARATUS

This nonprovisional application is based on Japanese Patent Application No. 2013-122619 filed on Jun. 11, 2013 with the Japan Patent Office, the entire contents of which are hereby incorporated by reference.

BACKGROUND OF THE INVENTION

Field of the Invention

The present invention relates to a ground fault detection apparatus, and in particular to a ground fault detection apparatus detecting a ground fault in an ungrounded alternating current (AC) circuit in which a single-phase three-wire AC power source is connected to a load via a first phase wire, a neutral wire, and a second phase wire.

Description of the Background Art

Japanese Patent Laying-Open No. 2012-122986 (Patent Document 1) discloses a ground fault detection apparatus detecting a ground fault in an ungrounded direct current (DC) circuit in which a DC power source is connected to a load via a positive-side DC bus and a negative-side DC bus. The ground fault detection apparatus includes first and second resistive elements having an identical resistance value. One terminals of the first and second resistive elements are connected to the positive-side DC bus and the negative-side DC bus, respectively, and the other terminals thereof are connected to each other. The ground fault detection apparatus further includes a current detector detecting a value of a current flowing between the other terminals of the first and second resistive elements and a ground point, and determines that a ground fault occurs in a case where the value detected by the current detector exceeds a predetermined threshold value.

SUMMARY OF THE INVENTION

It is also conceivable to apply the ground fault detection apparatus of Patent Document 1 to an ungrounded AC circuit in which a single-phase three-wire AC power source is connected to a load via a first phase wire, a neutral wire, and a second phase wire, and connect one terminals of the first and second resistive elements to the first phase wire and the second phase wire, respectively.

However, if the neutral wire has a ground fault when such connection is made, a current flowing from the first phase wire to the neutral wire via the first resistive element, the current detector, the ground point, and a ground fault point, and a current flowing from the neutral wire to the second phase wire via the ground fault point, the ground point, the current detector, and the second resistive element cancel each other, and thus a ground fault cannot be detected (see FIG. 8).

Accordingly, a main object of the present invention is to provide a ground fault detection apparatus capable of accurately detecting a ground fault in an ungrounded AC circuit.

A ground fault detection apparatus in accordance with the present invention is a ground fault detection apparatus detecting a ground fault in an ungrounded AC circuit in which a single-phase three-wire AC power source is connected to a load via a first phase wire, a neutral wire, and a second phase wire, including: a first resistive element and a second resistive element, one terminal of the first resistive element being connected to the first phase wire, one terminal of the second resistive element being connected to the second phase wire, the other terminal of the first resistive element and the other terminal of the second resistive element being connected to each other via a node; and a current detector detecting a value of a current flowing between the node and a ground point, wherein, in a case where the value detected by the current detector exceeds a predetermined threshold value, the ground fault detection apparatus determines that the ground fault occurs.

Preferably, the one terminal of the second resistive element is connected to the neutral wire, and the first resistive element and the second resistive element have an identical resistance value.

Preferably, the ground fault detection apparatus further includes a third resistive element, and a first switching element and a second switching element which are turned on alternately, wherein one terminal of the third resistive element is connected to the second phase wire, the other terminal of the third resistive element is connected to the other terminal of the first resistive element and the other terminal of the second resistive element via a predetermined node, the first switching element is connected in series with the first resistive element between the first phase wire and the node, and the second switching element is connected in series with the third resistive element between the second phase wire and the node.

Preferably, the third resistive element has a resistance value identical to those of the first resistive element and the second resistive element.

Preferably, the one terminal of the second resistive element is connected to the second phase wire, and the first resistive element and the second resistive element have resistance values different from each other.

Further, another ground fault detection apparatus in accordance with the present invention is a ground fault detection apparatus detecting a ground fault in an ungrounded AC circuit in which a single-phase three-wire AC power source is connected to a load via a first phase wire, a neutral wire, and a second phase wire, the single-phase three-wire AC power source having an inverter converting DC power supplied from a DC power source via a positive-side DC bus and a negative-side DC bus into AC power, and supplying the AC power to the load via the first phase wire and the second phase wire, and a voltage divider generating an intermediate voltage of the positive-side DC bus and the negative-side DC bus and providing the intermediate voltage to the neutral wire, the ground fault detection apparatus including: a first resistive element and a second resistive element, one terminal of the first resistive element being connected to the positive-side DC bus or the negative-side DC bus, one terminal of the second resistive element receiving the intermediate voltage, the other terminal of the first resistive element and the other terminal of the second resistive element being connected to each other via a node; and a current detector detecting a value of a current flowing between the node and a ground point, wherein, in a case where the value detected by the current detector exceeds a predetermined threshold value, the ground fault detection apparatus determines that the ground fault occurs.

Preferably, the first resistive element and the second resistive element have an identical resistance value.

Preferably, the ground fault detection apparatus further includes a third resistive element, and a first switching element and a second switching element, wherein one terminal of the first resistive element is connected to the positive-side DC bus, one terminal of the third resistive element is connected to the negative-side DC bus, the other terminal of the third resistive element is connected to the other terminal of the first resistive element and the other terminal of the second resistive element via the node, the first switching element is connected in series with the first resistive element between the positive-side DC bus and the node, and the second switching element is connected in series with the third resistive element between the negative-side DC bus and the node.

Preferably, the third resistive element has a resistance value identical to those of the first resistive element and the second resistive element.

The ground fault detection apparatus in accordance with the present invention can also detect a ground fault in the neutral wire, and can accurately detect a ground fault in the ungrounded AC circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an operation of the ground fault detection apparatus in a case where a neutral wire shown in FIG. 1 has a ground fault.

FIG. 4 shows an operation of the ground fault detection apparatus in a case where a U phase wire shown in FIG. 1 has a ground fault.

FIG. 6 shows an operation of the ground fault detection apparatus in a case where a V phase wire shown in FIG. 1 has a ground fault.

FIG. 7 shows time charts showing simulation results of currents I1, I2, Ig shown in FIG. 6.

FIG. 8 is a circuit block diagram showing a comparative example of Embodiment 1.

FIG. 9 is a circuit block diagram showing a configuration of a ground fault detection apparatus in accordance with Embodiment 2 of the present invention.

FIG. 10 shows an operation of the ground fault detection apparatus in a case where a neutral wire shown in FIG. 9 has a ground fault.

FIG. 12 shows an operation of the ground fault detection apparatus in a case where a U phase wire shown in FIG. 9 has a ground fault.

FIG. 14 shows an operation of the ground fault detection apparatus in a case where a V phase wire shown in FIG. 9 has a ground fault.

FIG. 25 shows an operation of the ground fault detection apparatus in a case where a U phase wire shown in FIG. 23 has a ground fault.

FIG. 26 shows an operation of the ground fault detection apparatus in a case where a V phase wire shown in FIG. 23 has a ground fault.

DESCRIPTION OF THE PREFERRED EMBODIMENTS

Embodiment 1

Figure 1:
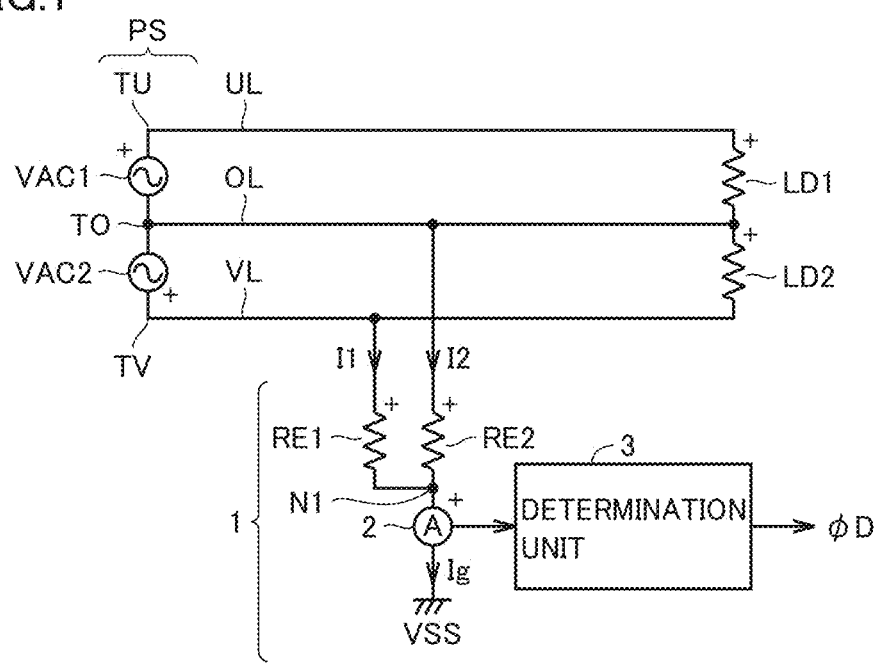
FIG. 1 is a circuit block diagram showing a configuration of a ground fault detection apparatus in accordance with Embodiment 1 of the present invention.

A ground fault detection apparatus 1 in accordance with Embodiment 1 of the invention of the present application is an apparatus detecting a ground fault in an ungrounded AC circuit, and includes resistive elements RE1, RE2, a current detector 2, and a determination unit 3, as shown in FIG. 1. The ungrounded AC circuit includes a single-phase three-wire AC power source PS, a U phase wire UL, a neutral wire OL, a V phase wire VL, and loads LD1, LD2.

Single-phase three-wire AC power source PS is formed, for example, by equally dividing a secondary winding of a transformer into two, and includes a U phase terminal TU, a neutral terminal TO, and a V phase terminal TV. The voltage between terminals TU and TO is 100 (V), the voltage between terminals TV and TO is 100 (V), and the voltage between terminals TU and TV is 200 (V). An AC voltage VAC1 between terminals TU and TO and an AC voltage VAC2 between terminals TV and TO are 180° out of phase with each other.

U phase terminal TU is connected to one terminal of load LD1 via U phase wire UL. Neutral terminal TO is connected to the other terminal of load LD1 and one terminal of load LD2 via neutral wire OL. V phase terminal TV is connected to the other terminal of load LD2 via V phase wire VL. None of U phase wire UL, neutral wire OL, and V phase wire VL is grounded.

Resistive elements RE1, RE2 of ground fault detection apparatus 1 have an identical resistance value. Resistive elements RE1, RE2 have one terminals connected to V phase wire VL and neutral wire OL, respectively, and the other terminals connected to each other via a node N1. Current detector 2 detects an instantaneous value of a current Ig flowing from the other terminals of resistive elements RE1, RE2 (i.e., node N1) to a line of a ground voltage VSS (ground point), and provides a signal indicating the detected value to determination unit 3. The line of ground voltage VSS is, for example, an automobile chassis.

Determination unit 3 generates a ground fault detection signal φD indicating whether or not a ground fault accident occurs in the ungrounded AC circuit, based on the output signal of current detector 2. In a case where no ground fault accident occurs and thus the absolute value of the instantaneous value of current Ig is lower than a predetermined threshold value ITH, ground fault detection signal φD is set to an "L" level, which is a deactivated level. In a case where a ground fault accident occurs and thus the absolute value of the instantaneous value of current Ig exceeds predetermined threshold value ITH, ground fault detection signal φD is set to an "H" level, which is an activated level.

Next, an operation of ground fault detection apparatus 1 will be described. A current flowing from V phase wire VL into resistive element RE1 is referred to as I1, and a current flowing from neutral wire OL into resistive element RE2 is referred to as I2. Further, the resistance values of resistive elements RE1, RE2 are referred to as R1, R2, respectively. R1, R2 are set as R1=R2, and each of R1, R2 is, for example, 40 (kΩ). In addition, effective values of AC voltages VAC1, VAC2 are referred to as Vac1, Vac2, respectively. Vac1, Vac2 are set as Vac1=Vac2, and each of Vac1, Vac2 is 100 (V).

In the case where no ground fault accident occurs, a current I=I1=−I2=Vac2/(R1+R2)=Vac2/(2·R1) flows from V phase wire VL, via resistive elements RE1, RE2, to neutral wire OL. On this occasion, current Ig is set as Ig=I1+I2=0 (mA). Therefore, |Ig|<ITH is obtained, and ground fault detection signal φD is set to an "L" level as a deactivated level.

FIG. 2(*a*) is a circuit diagram showing a path of a current flowing in a case where a given point Pg in neutral wire OL has a ground fault. In FIG. 2(*a*), when point Pg in neutral wire OL has a ground fault, a low impedance current path is formed between a negative-side terminal of current detector 2 and ground fault point Pg, and a current flows through a path from V phase terminal TV, via V phase wire VL, resistive element RE1, current detector 2, the line of ground voltage VSS, ground fault point Pg, and neutral wire OL, to neutral terminal TO. When the ground fault path has an impedance of 0Ω, the current flowing through current detector 2 is set as Ig=Vac2/R1.

That is, current Ig having a value up to twice the value of current I1, I2 flowing through resistive element RE1, RE2 under normal operation conditions flows through current detector 2. Since current Ig is normally Ig=0 (mA), in a case where a current having a value exceeding threshold value ITH flows through current detector 2, it can be determined that a ground fault occurs. It is noted that, normally, a current supplied to loads LD1, LD2 is sufficiently larger than Ig=Vac2/R1, and thus the current supplied to loads LD1, LD2 does not change even if neutral wire OL has a ground fault, and a ground fault current does not change depending on the magnitude of loads LD1, LD2.

Figure 3:
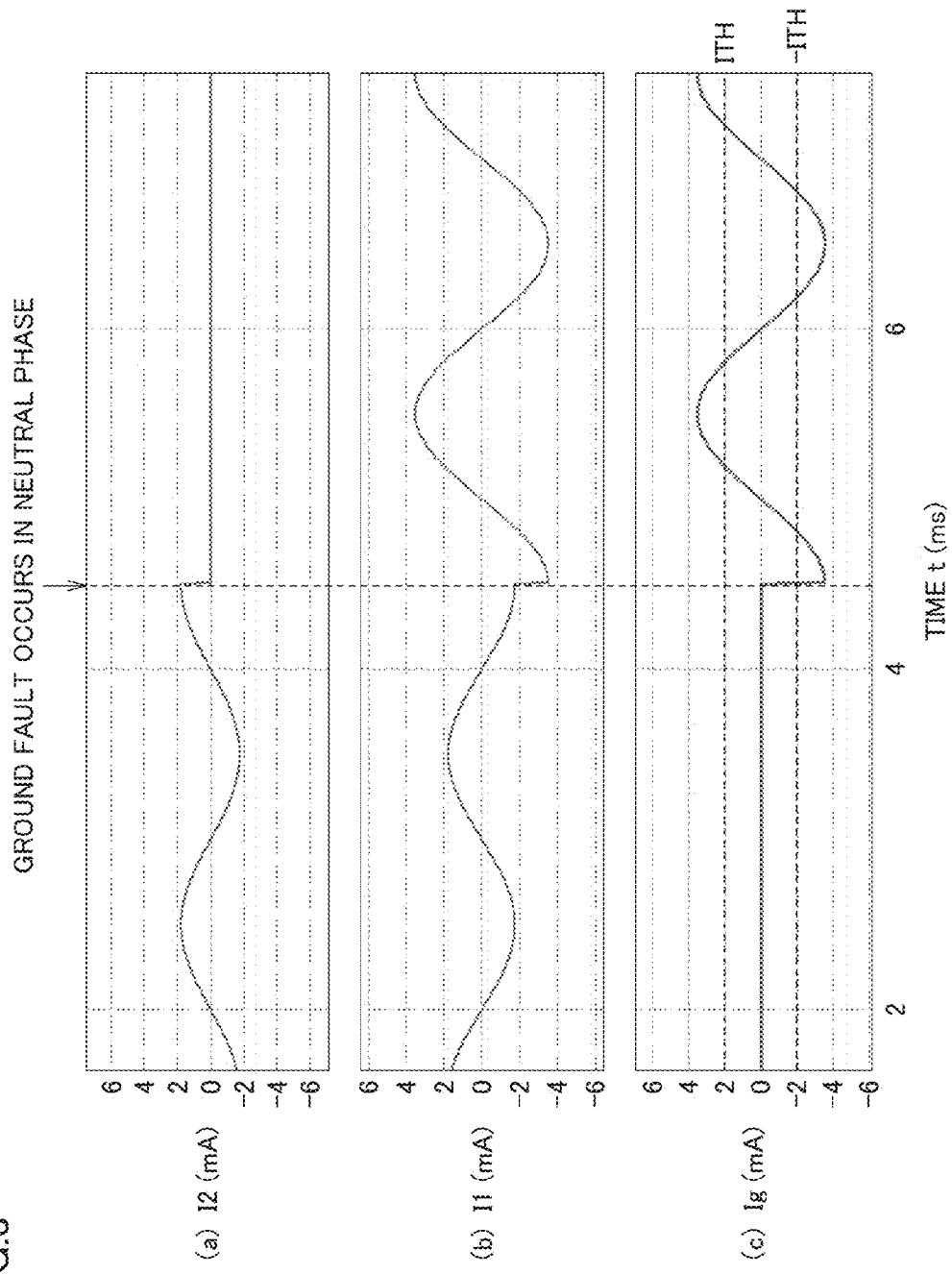
FIG. 3 shows time charts showing simulation results of currents I1, I2, Ig shown in FIG. 2.

FIG. 2(*b*) and FIGS. 3(*a*) to 3(*c*) are time charts showing simulation results of temporal changes of currents I1, I2, Ig in the case where point Pg in neutral wire OL has a ground fault at a given time. In FIG. 2(*b*) and FIGS. 3(*a*) to 3(*c*), in a normal state before a ground fault accident occurs, currents I1, I2 flowing through resistive elements RE1, RE2 have opposite phases, and current Ig is set as Ig=I1+I2=0 (mA). Therefore, |Ig|<ITH is obtained, and ground fault detection signal φD is set to an "L" level as a deactivated level.

It is noted that, although threshold value ITH is set as ITH=2 (mA) in FIG. 2(*b*) and FIG. 3(*c*), it is merely set as ITH=2 (mA) to avoid making the drawings complicated, and in fact, ITH may be set to any value which can avoid a malfunction due to noise and can accurately detect a ground fault accident in U phase wire UL, neutral wire OL, and V phase wire VL. Concerning the value of ITH, the same applies hereinafter.

When a ground fault occurs at point Pg in neutral wire OL at a given time, the current flows through the path shown in FIG. 2(*a*), current I2 is set as I2=0 (mA) and current Ig is set as Ig=I1, and the absolute value of the instantaneous value of Ig exceeds threshold value ITH. Determination unit 3 in FIG. 1 sets ground fault detection signal φD to an "H" level as an activated level in response to the absolute value of the instantaneous value of Ig exceeding threshold value ITH, and notifies a user of the ungrounded AC circuit of the occurrence of a ground fault accident.

FIG. 4(*a*) is a circuit diagram showing paths of currents flowing in a case where point Pg in U phase wire UL has a ground fault. In FIG. 4(*a*), when point Pg in U phase wire UL has a ground fault, a low impedance current path is formed between the negative-side terminal of current detector 2 and ground fault point Pg, and current I1 flows through a path from V phase terminal TV, via V phase wire VL, resistive element RE1, current detector 2, the line of ground voltage VSS, ground fault point Pg, and U phase wire UL, to U phase terminal TU. Further, current I2 flows through a path from neutral terminal TO, via neutral wire OL, resistive element RE2, current detector 2, the line of ground voltage VSS, ground fault point Pg, and U phase wire UL, to U phase terminal TU. When the ground fault path has an impedance of 0Ω, the current flowing through current detector 2 is set as Ig=(Vac1+Vac2)/R1+Vac1/R2=3·Vac1/R1.

That is, current Ig having a value up to six times the value of current I1, I2 flowing through resistive element RE1, RE2 under normal operation conditions flows through current detector 2. Since current Ig is normally Ig=0 (mA), in the case where a current having a value exceeding threshold value ITH flows through current detector 2, it can be determined that a ground fault occurs. It is noted that, normally, the current supplied to loads LD1, LD2 is sufficiently larger than Ig=3·Vac1/R1, and thus the current supplied to loads LD1, LD2 does not change even if U phase wire UL has a ground fault, and the ground fault current does not change depending on the magnitude of loads LD1, LD2.

Figure 5:
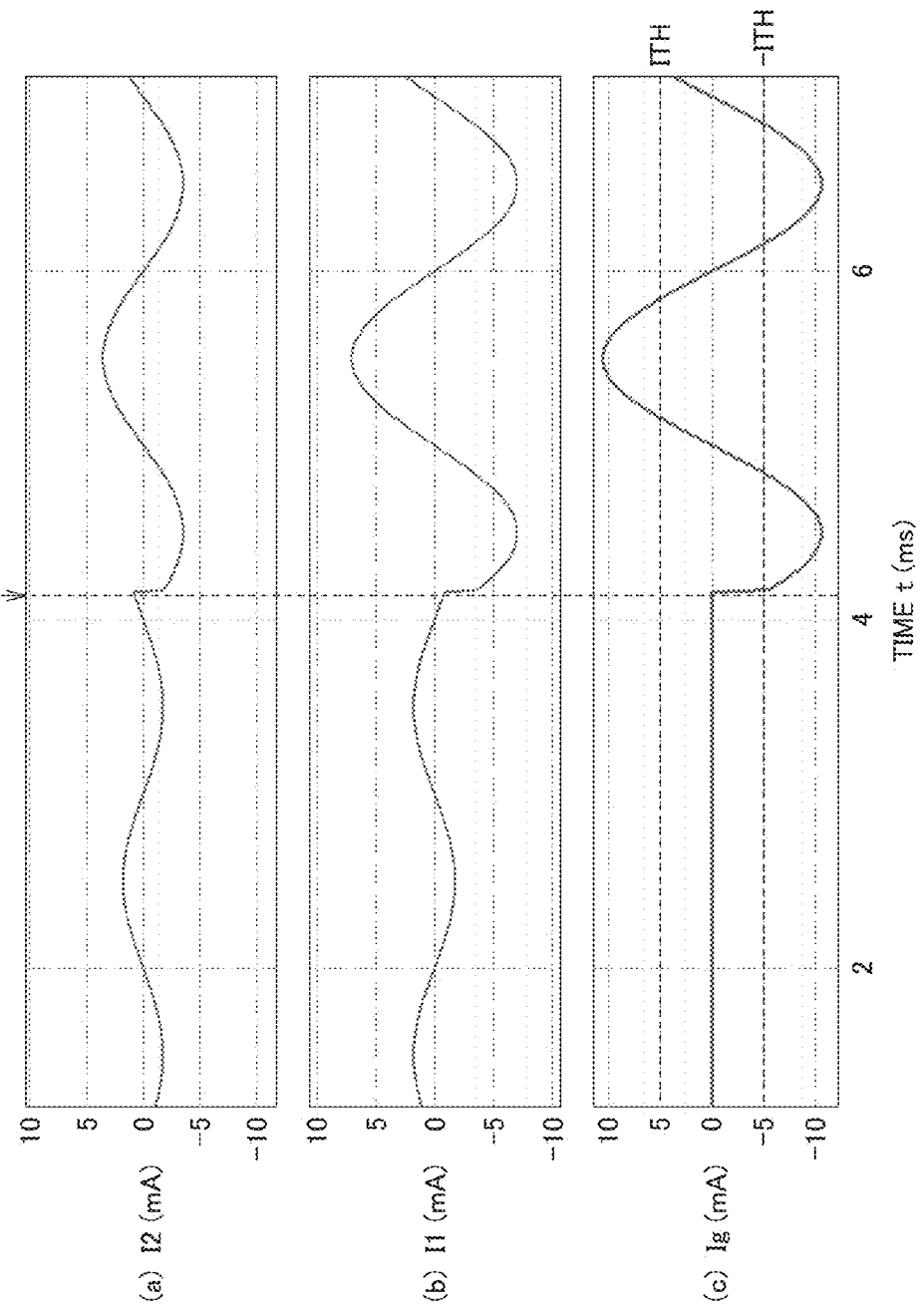
FIG. 5 shows time charts showing simulation results of currents I1, I2, Ig shown in FIG. 4.
Figure 11:
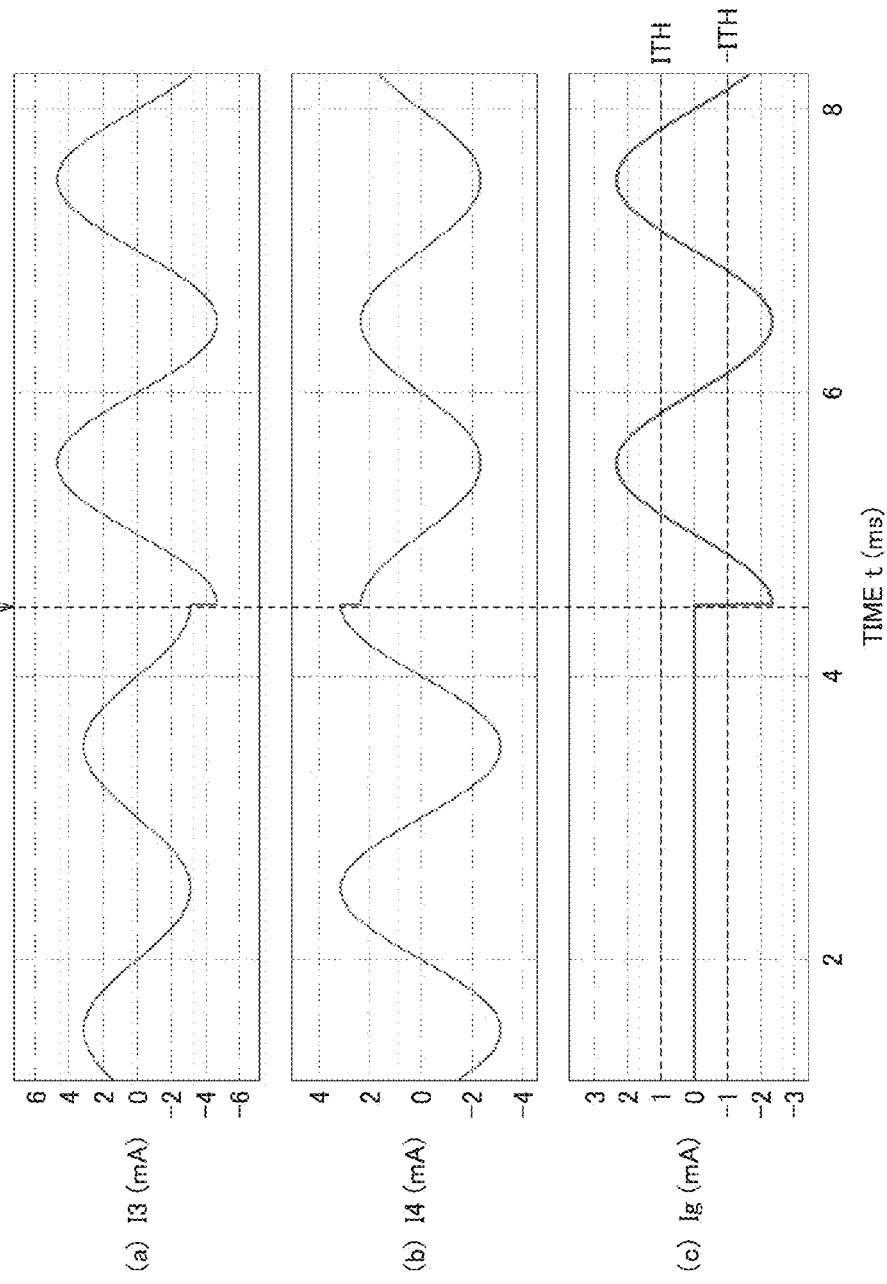
FIG. 11 shows time charts showing simulation results of currents I3, I4, Ig shown in FIG. 10.
Figure 13:
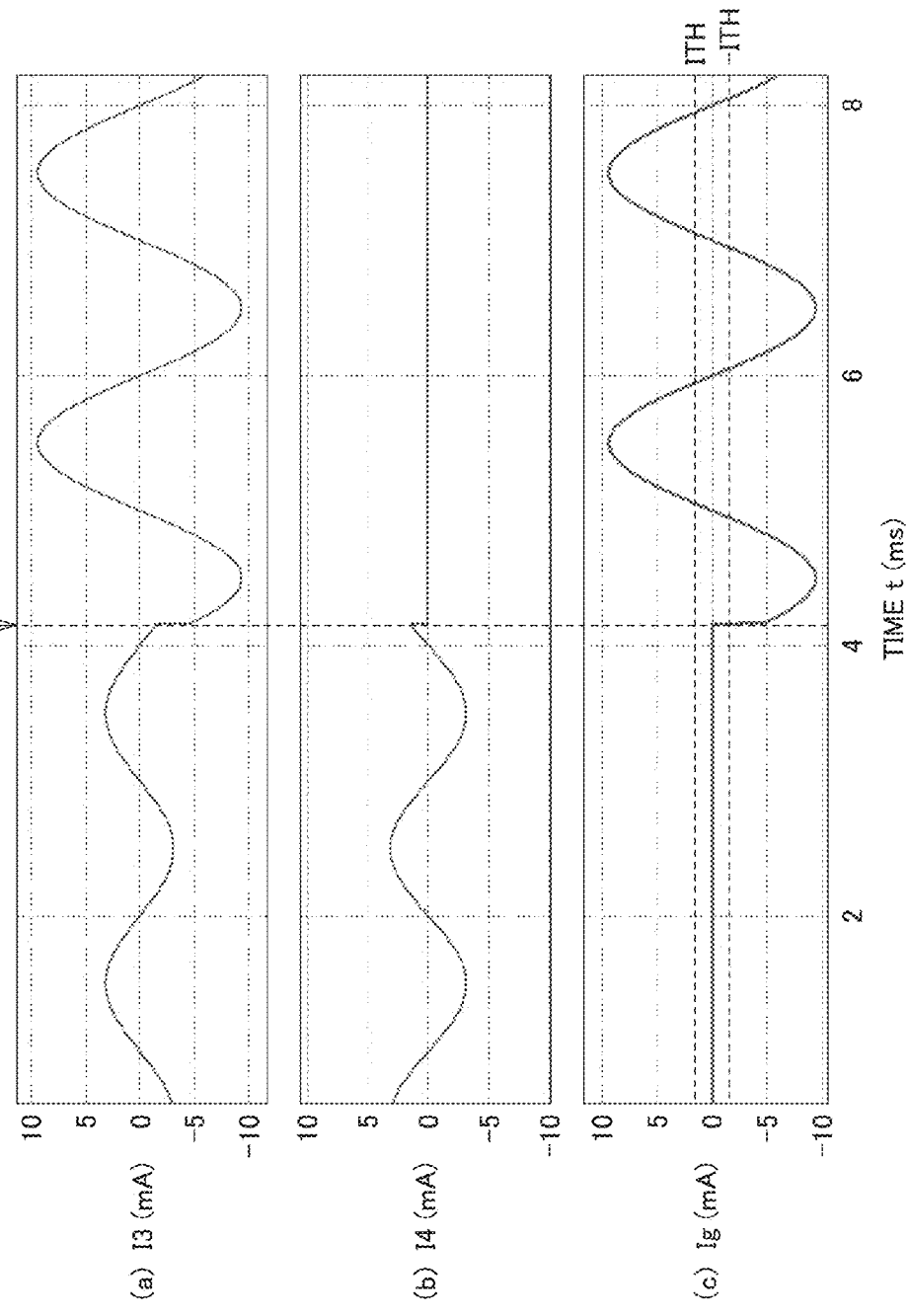
FIG. 13 shows time charts showing simulation results of currents I3, I4, Ig shown in FIG. 12.

FIG. 4(*b*) and FIGS. 5(*a*) to 5(*c*) are time charts showing simulation results of temporal changes of currents I1, I2, Ig in the case where point Pg in U phase wire UL has a ground fault at a given time. In FIG. 4(*b*) and FIGS. 5(*a*) to 5(*c*), in a normal state before a ground fault accident occurs, current I1 and current I2 have opposite phases, and current Ig is set as Ig=I1+I2=0 (mA).

When a ground fault occurs at point Pg in U phase wire UL at a given time, the currents flow through the paths shown in FIG. 4(*a*), and the absolute value of the instantaneous value of Ig=3·Vac1/R1 exceeds threshold value ITH. Determination unit 3 in FIG. 1 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

FIG. 6(*a*) is a circuit diagram showing a path of a current flowing in a case where point Pg in V phase wire VL has a ground fault. In FIG. 6(*a*), when point Pg in V phase wire VL has a ground fault, a low impedance current path is formed between the negative-side terminal of current detector 2 and ground fault point Pg, and a current flows through a path from V phase terminal TV, via V phase wire VL, ground fault point Pg, the line of ground voltage VSS, current detector 2, resistive element RE2, and neutral wire OL, to neutral terminal TO. When the ground fault path has an impedance of 0Ω, the current flowing through current detector 2 is set as Ig=Vac2/R2.

That is, current Ig having a value up to twice the value of current I1, I2 flowing through resistive element RE1, RE2 under normal operation conditions flows through current detector 2. Since current Ig is normally Ig=0 (mA), in the case where a current having a value exceeding threshold value ITH flows through current detector 2, it can be determined that a ground fault occurs. It is noted that, normally, the current supplied to loads LD1, LD2 is sufficiently larger than Ig=Vac2/R2, and thus the current supplied to loads LD1, LD2 does not change even if V phase wire VL has a ground fault, and the ground fault current does not change depending on the magnitude of loads LD1, LD2.

FIG. 6(b) and FIGS. 7(a) to 7(c) are time charts showing simulation results of temporal changes of currents I1, I2, Ig in the case where point Pg in V phase wire VL has a ground fault at a given time. In FIG. 6(b) and FIGS. 7(a) to 7(c), in a normal state before a ground fault accident occurs, currents I1 and current I2 have opposite phases, and current Ig is set as Ig=I1+I2=0 (mA).

When a ground fault occurs at point Pg in V phase wire VL at a given time, the current flows through the path shown in FIG. 6(a), current I1 is set as I1=0 (mA) and current Ig is set as Ig=I2, and the absolute value of the instantaneous value of Ig=Vac2/R2 exceeds threshold value ITH. Determination unit 3 in FIG. 1 sets ground fault detection signal <D to an "H" level as an activated level in response to the absolute value of the instantaneous value of Ig exceeding threshold value ITH, and notifies the user of the ungrounded AC circuit of the occurrence of a ground fault accident.

FIG. 8 is a circuit block diagram showing a comparative example of Embodiment 1, and is a view to be compared with FIG. 1. Referring to FIG. 8, the comparative example is different from Embodiment 1 in that the one terminal of resistive element RE2 is connected to U phase wire UL. FIG. 8 shows a state in which point Pg in neutral wire OL has a ground fault. In this case, current I1 flows through a path from V phase terminal TV, via V phase wire VL, resistive element RE1, current detector 2, the line of ground voltage VSS, ground fault point Pg, and neutral wire OL, to neutral terminal TO. Further, a current (-I2) flows through a path from neutral terminal TO, via neutral wire OL, ground fault point Pg, the line of ground voltage VSS, current detector 2, resistive element RE2, and U phase wire UL, to U phase terminal TU. The current flowing through current detector 2 is set as Ig=I1-I2=0 (mA), and a ground fault cannot be detected.

As described above, in Embodiment 1, the one terminals of resistive elements RE1, RE2 having identical resistance values R1, R2 are connected to V phase wire VL and neutral wire OL, respectively, current detector 2 is connected between the other terminals of resistive elements RE1, RE2 and the ground point, and, in the case where current Ig flowing through current detector 2 exceeds threshold value ITH, it is determined that a ground fault occurs. Therefore, in the case where any of U phase wire UL, V phase wire VL, and neutral wire OL has a ground fault, the occurrence of the ground fault can be detected.

In addition, by using resistive elements RE1, RE2 having high resistance values R1, R2, even if a current flows through a human body when a one-point ground fault occurs, the ground fault can be detected without seriously affecting the human body.

That is, in Embodiment 1, when U phase wire UL has a ground fault, the largest current flows on the occurrence of a ground fault accident, and resistance values R1, R2 of resistive elements RE1, RE2 are set such that the current on this occasion does not cause a harmful effect on the human body. For example, when it is set that Vac1=Vac2=100 (V) and R1=R2, Ig is set as Ig=Vac1/R2+(Vac1+Vac2)/R1=300/R1 (RMS: root mean square value). When the value of the current which does not cause a harmful effect on the human body is less than 10 (mA), it is satisfactory if R1>30 (kΩ). Further, if R1=30 (kΩ), in the case where V phase wire VL or neutral wire OL has a ground fault, a current of 3.3 (mA), which is one third of 10 (mA), flows through the human body.

It is noted that, although the one terminals of resistive elements RE1, RE2 are connected to V phase wire VL and neutral wire OL, respectively, in Embodiment 1, it is needless to say that the same effect can also be obtained when the one terminals of resistive elements RE1, RE2 are connected to U phase wire UL and neutral wire OL, respectively.

Embodiment 2

FIG. 9 is a circuit block diagram showing a configuration of a ground fault detection apparatus 5 in accordance with Embodiment 2 of the present invention, and is a view to be compared with FIG. 1. Referring to FIG. 9, ground fault detection apparatus 5 is different from ground fault detection apparatus 1 in FIG. 1 in that resistive elements RE1, RE2 are replaced by resistive elements RE3, RE4, respectively, and one terminals of resistive elements RE3, RE4 are connected to V phase wire VL and U phase wire UL, respectively. Further, a resistance value R3 of resistive element RE3 and a resistance value R4 of resistive element RE4 are different from each other. For example, R3 is 30 (kΩ), and R4 is 60 (kΩ).

Next, an operation of ground fault detection apparatus 5 will be described. A current flowing from V phase wire VL into resistive element RE3 is referred to as I3, and a current flowing from U phase wire UL into resistive element RE4 is referred to as I4. In a case where no ground fault accident occurs, when the voltage of V phase wire VL is higher than the voltage of U phase wire UL, current I=I3=-I4=2·Vac1/(R3+R4) flows from V phase wire VL, via resistive elements RE3, RE4, to U phase wire UL. On this occasion, current Ig is set as Ig=I3+I4=0 (mA). Therefore, |Ig|<ITH is obtained, and ground fault detection signal ɸD is set to an "L" level as a deactivated level.

FIG. 10(a) is a circuit diagram showing a path of a current flowing in a case where point Pg in neutral wire OL has a ground fault. In FIG. 10(a), when point Pg in neutral wire OL has a ground fault, a low impedance current path is formed between the negative-side terminal of current detector 2 and ground fault point Pg. Thereby, current I3 flowing from V phase terminal TV through V phase wire VL and resistive element RE3 is divided into a first path leading to U phase wire UL via resistive element RE4, and a second path leading to neutral wire OL via current detector 2, the line of ground voltage VSS, and ground fault point Pg. When the ground fault path has an impedance of 0Ω, the current flowing through current detector 2 is set as Ig=Vac2/R3−Vac1/R4=100·(R4−R3)/(R3·R4).

That is, when R3≠R4, current Ig is set as Ig≠0 (mA), and the current flows through current detector 2. Since current Ig is normally Ig=0 (mA), in the case where a current having a value exceeding threshold value ITH flows through current detector 2, it can be determined that a ground fault occurs.

It is noted that, normally, the current supplied to loads LD1, LD2 is sufficiently larger than Ig=100·(R4−R3)/(R3·R4), and thus the current supplied to loads LD1, LD2 does not change even if neutral wire OL has a ground fault, and the ground fault current does not change depending on the magnitude of loads LD1, LD2.

FIG. 10(b) and FIGS. 11(a) to 11(c) are time charts showing simulation results of temporal changes of currents I3, I4, Ig in the case where point Pg in neutral wire OL has a ground fault at a given time. In FIG. 10(b) and FIGS. 11(a) to 11(c), in a normal state before a ground fault accident occurs, currents I3 and current I4 have opposite phases, and current Ig is set as Ig=I3+I4=0 (mA).

When a ground fault occurs at point Pg in neutral wire OL at a given time, the current flows through the paths shown in FIG. 10(a), and the absolute value of the instantaneous value of Ig exceeds threshold value ITH. Determination unit 3 in FIG. 9 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

FIG. 12(a) is a circuit diagram showing a path of a current flowing in a case where point Pg in U phase wire UL has a ground fault. In FIG. 12(a), when point Pg in U phase wire UL has a ground fault, a low impedance current path is formed between the negative-side terminal of current detector 2 and ground fault point Pg, and current I3 flows through a path from V phase terminal TV, via V phase wire VL, resistive element RE3, current detector 2, the line of ground voltage VSS, ground fault point Pg, and U phase wire UL, to U phase terminal TU. When the ground fault path has an impedance of 0Ω, the current flowing through current detector 2 is set as Ig=(Vac1+Vac2)/R3=2·Vac1/R3.

Current Ig having a value up to three times the value of current I3, I4 flowing through resistive element RE3, RE4 under normal operation conditions flows through current detector 2. Since current Ig is normally Ig=0 (mA), in the case where a current having a value exceeding threshold value ITH flows through current detector 2, it can be determined that a ground fault occurs. It is noted that, normally, the current supplied to loads LD1, LD2 is sufficiently larger than Ig=2·Vac1/R3, and thus the current supplied to loads LD1, LD2 does not change even if U phase wire UL has a ground fault, and the ground fault current does not change depending on the magnitude of loads LD1, LD2.

FIG. 12(b) and FIGS. 13(a) to 13(c) are time charts showing simulation results of temporal changes of currents I3, I4, Ig in the case where point Pg in U phase wire UL has a ground fault at a given time. In FIG. 12(b) and FIGS. 13(a) to 13(c), in a normal state before a ground fault accident occurs, current I3 and current I4 have opposite phases, and current Ig is set as Ig=I3+I4=0 (mA).

When a ground fault occurs at point Pg in U phase wire UL at a given time, the current flows through the path shown in FIG. 12(a), and the absolute value of the instantaneous value of Ig=2·Vac1/R3 exceeds threshold value ITH. Determination unit 3 in FIG. 9 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

FIG. 14(a) is a circuit diagram showing a path of a current flowing in a case where point Pg in V phase wire VL has a ground fault. In FIG. 14(a), when point Pg in V phase wire VL has a ground fault, a low impedance current path is formed between the negative-side terminal of current detector 2 and ground fault point Pg, and a current flows through a path from V phase terminal TV, via V phase wire VL, ground fault point Pg, the line of ground voltage VSS, current detector 2, resistive element RE4, and U phase wire UL, to U phase terminal TU. When the ground fault path has an impedance of 0Ω, the current flowing through current detector 2 is set as Ig=2·Vac2/R4.

That is, current Ig having a value up to three times the value of current I3, I4 flowing through resistive element RE3, RE4 under normal operation conditions flows through current detector 2. Since current Ig is normally Ig=0 (mA), in the case where a current having a value exceeding threshold value ITH flows through current detector 2, it can be determined that a ground fault occurs. It is noted that, normally, the current supplied to loads LD1, LD2 is sufficiently larger than Ig=2·Vac2/R4, and thus the current supplied to loads LD1, LD2 does not change even if V phase wire VL has a ground fault, and the ground fault current does not change depending on the magnitude of loads LD1, LD2.

FIG. 14(b) is a time chart showing simulation results of temporal changes of currents I3, I4, Ig in the case where point Pg in V phase wire VL has a ground fault at a given time. In FIG. 14(b), in a normal state before a ground fault accident occurs, currents I3 and current I4 have opposite phases, and current Ig is set as Ig=I3+I4=0 (mA).

When a ground fault occurs at point Pg in V phase wire VL at a given time, the current flows through the path shown in FIG. 14(a), current I3 is set as I3=0 (mA) and current Ig is set as Ig=I4, and the absolute value of the instantaneous value of Ig=2·Vac2/R4 exceeds threshold value ITH. Determination unit 3 in FIG. 9 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

In Embodiment 2, the one terminals of resistive elements RE3, RE4 having resistance values R3, R4 different from each other are connected to V phase wire VL and U phase wire UL, respectively, current detector 2 is connected between the other terminals of resistive elements RE3, RE4 and the ground point, and, in the case where current Ig flowing through current detector 2 exceeds threshold value ITH, it is determined that a ground fault occurs. Therefore, in the case where any of U phase wire UL, V phase wire VL, and neutral wire OL has a ground fault, the occurrence of the ground fault can be detected.

In addition, by using resistive elements RE3, RE4 having high resistance values, even if a current flows through a human body when a one-point ground fault occurs, the ground fault can be detected without seriously affecting the human body.

That is, in Embodiment 2, when U phase wire UL has a ground fault, the largest current flows on the occurrence of a ground fault accident, and resistance values R3, R4 of resistive elements RE3, RE4 are set such that the current on this occasion does not cause a harmful effect on the human body. For example, when it is set that Vac1=Vac2=100 (V), Ig is set as Ig=(Vac1+Vac2)/R3=200/R3 (RMS). When the value of the current which does not cause a harmful effect on the human body is less than 10 (mA), it is satisfactory if R3>20 (kΩ) and R4>20 (kW). Further, if R3=30 (kΩ) and R4=60 (kΩ), neutral wire OL has a ground fault current of 100×(60−30)/30×60=1.67 (mA).

It is noted that, when R3+R4=R1+R2, a current flowing through a resistive element in a normal state is larger in Embodiment 2, and power consumed in the resistive element is increased.

Further, since current Ig flowing through current detector 2 differs depending on the phase where a ground fault occurs, highly accurate current detector 2 is required. In the above example, current detector 2 capable of measuring a current of 1.67 (mA) is required.

Embodiment 3

Figure 15:
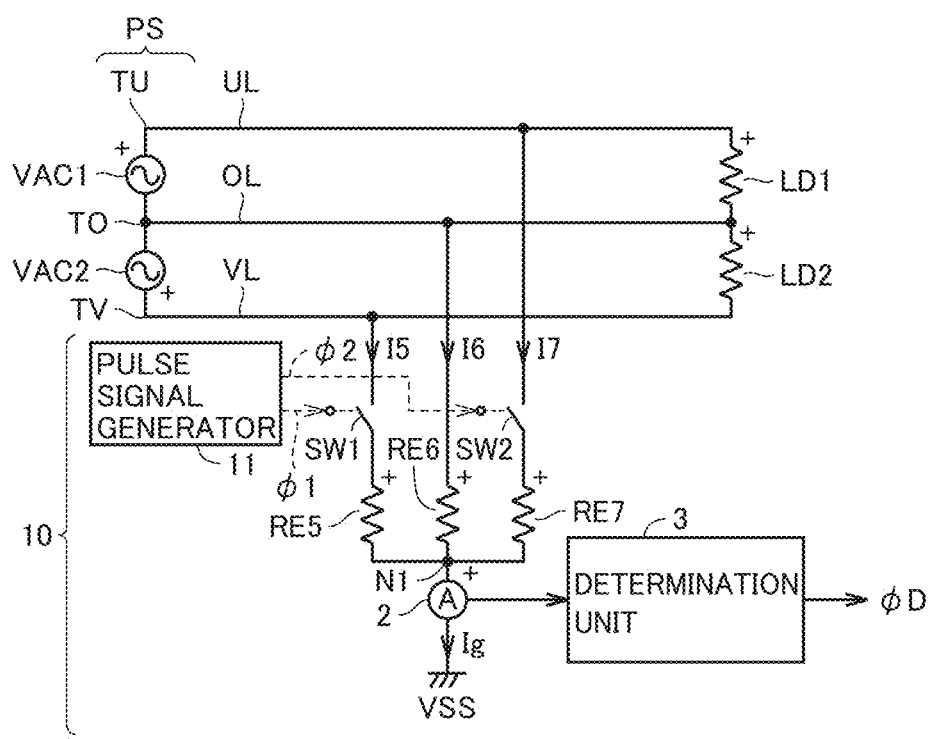
FIG. 15 is a circuit block diagram showing a configuration of a ground fault detection apparatus in accordance with Embodiment 3 of the present invention.
Figure 16:
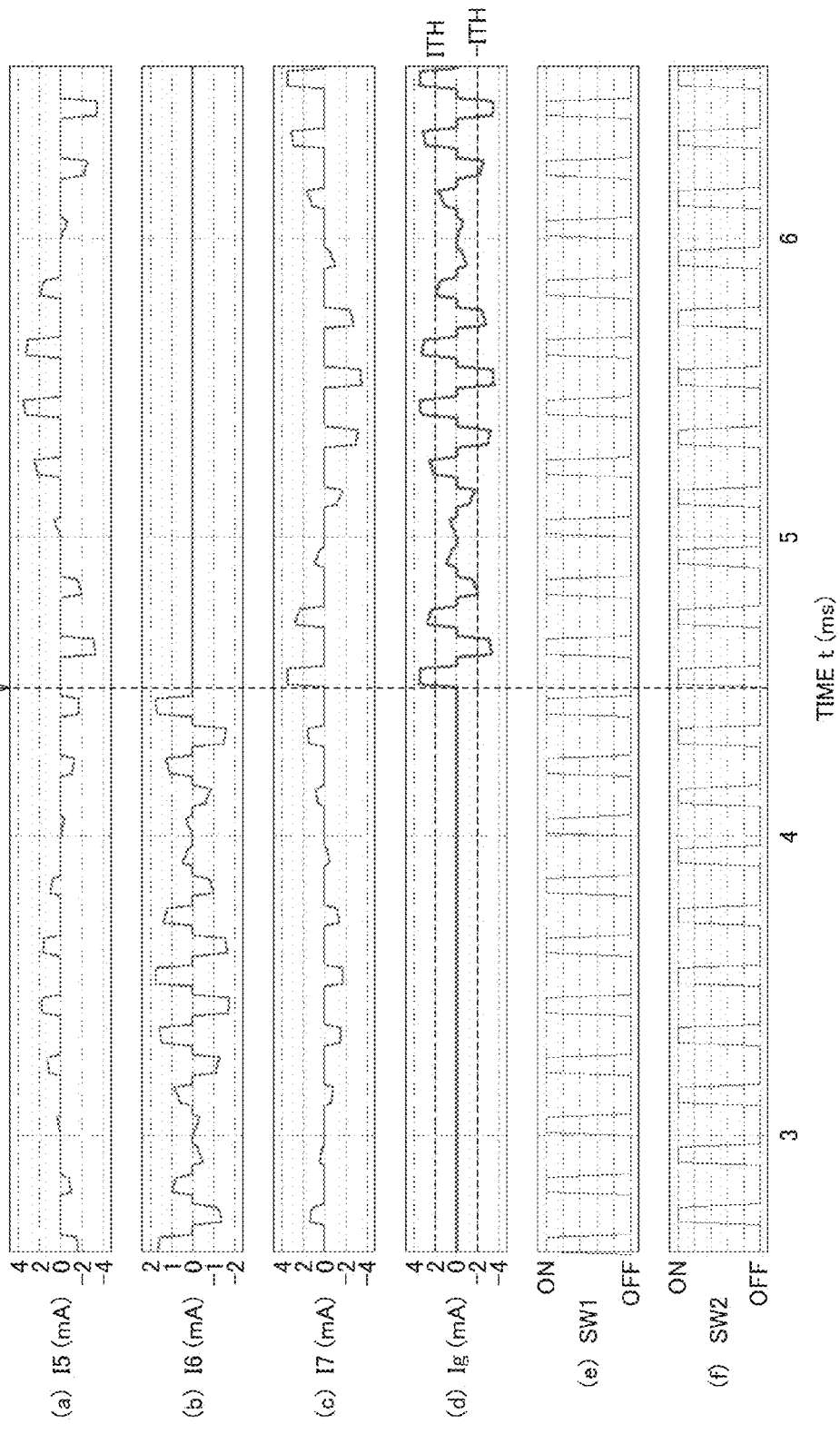
FIG. 16 shows an operation of the ground fault detection apparatus in a case where a neutral wire shown in FIG. 15 has a ground fault.
Figure 17:
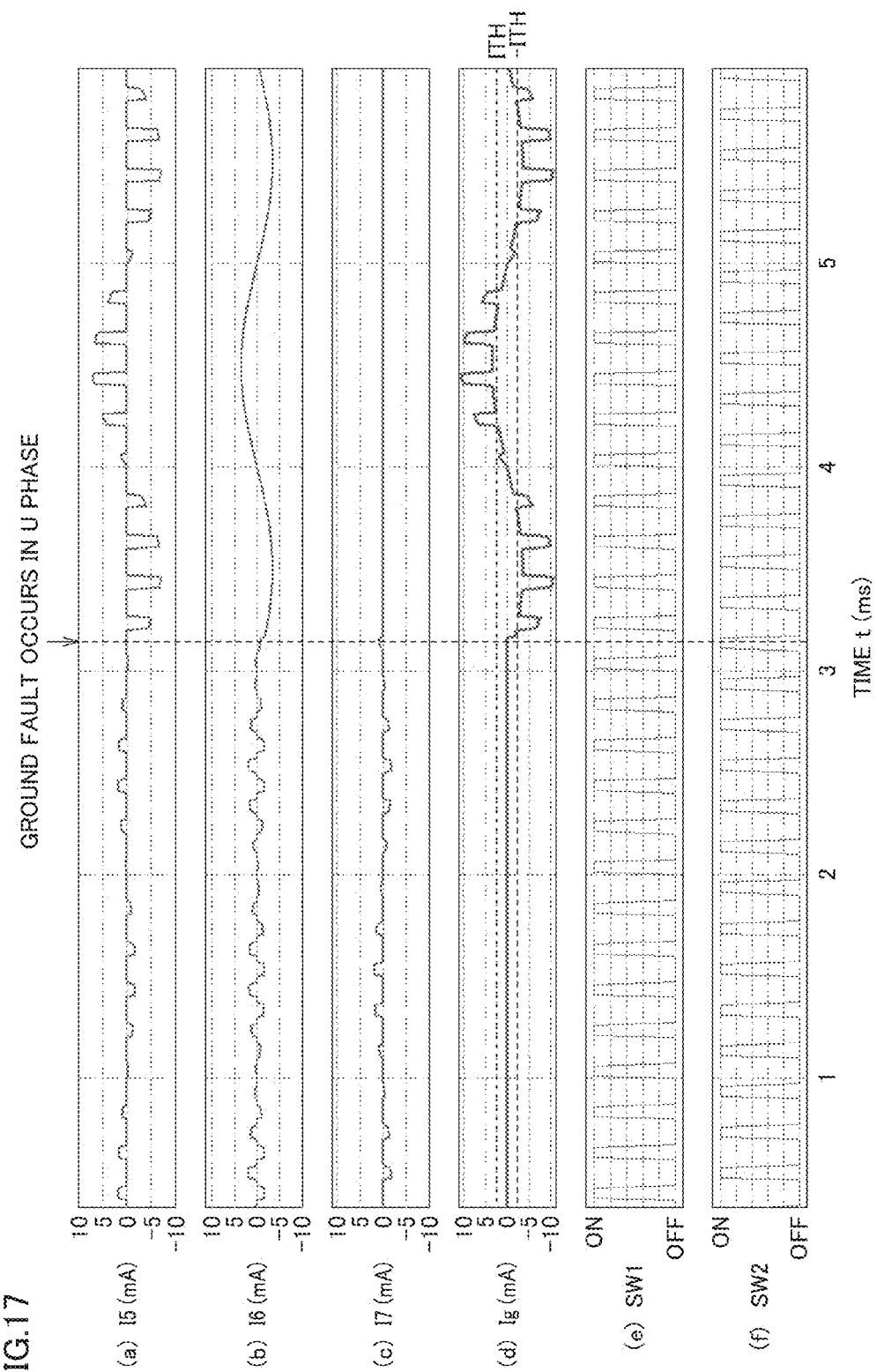
FIG. 17 shows an operation of the ground fault detection apparatus in a case where a U phase wire shown in FIG. 15 has a ground fault.
Figure 18:
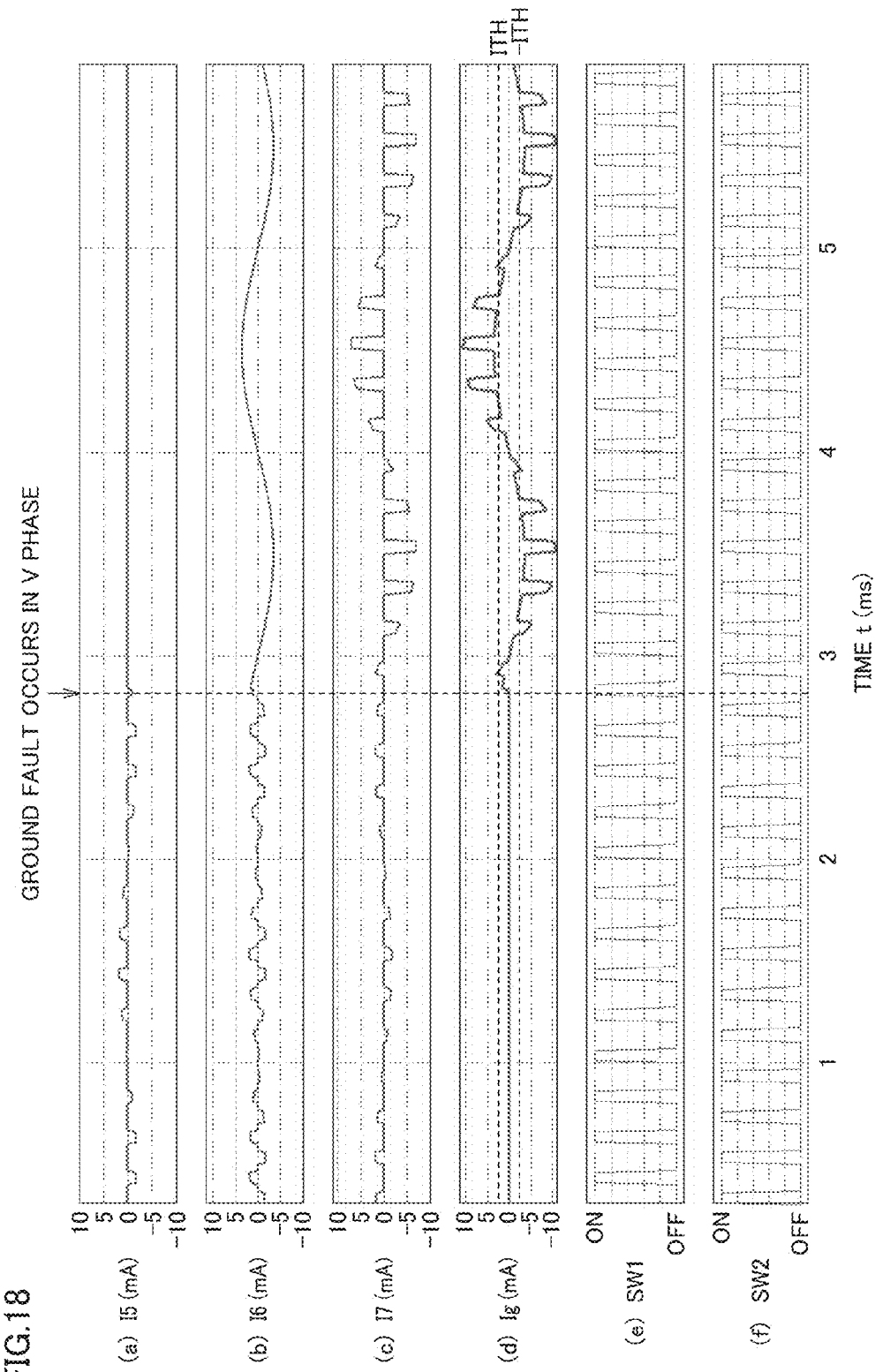
FIG. 18 shows an operation of the ground fault detection apparatus in a case where a V phase wire shown in FIG. 15 has a ground fault.

FIG. 15 is a circuit block diagram showing a configuration of a ground fault detection apparatus 10 in accordance with Embodiment 3 of the present invention, and is a view to be compared with FIG. 1. Referring to FIG. 15, ground fault detection apparatus 10 is different from ground fault detection apparatus 1 in FIG. 1 in that resistive elements RE1, RE2 are replaced by resistive elements RE5 to RE7, and switches SW1, SW2 and a pulse signal generator 11 are added.

Switch SW1 is connected in series with resistive element RE5 between V phase wire VL and node N1. Resistive element RE6 is connected between neutral wire OL and node N1. Switch SW2 is connected in series with resistive element RE7 between U phase wire UL and node N1. Current detector 2 is connected between node N1 and the line of ground voltage VSS. Resistive elements RE5 to RE7 have an identical resistance value.

Switches SW1, SW2 are controlled by pulse signals φ1, φ2, respectively, from pulse signal generator 11. Switch SW1 is ON when signal φ1 is at an "H" level, and is OFF when signal φ1 is at an "L" level. Switch SW2 is ON when signal φ2 is at an "H" level, and is OFF when signal φ2 is at an "L" level.

Pulse signal generator 11 sets pulse signal φ1 to an "H" level for a predetermined time with a predetermined cycle, and sets pulse signal φ2 to an "H" level for the predetermined time with the predetermined cycle. Pulse signal φ1 is set to an "H" level for the predetermined time within a time period in which pulse signal φ2 is at an "L" level, and pulse signal φ2 is set to an "H" level for the predetermined time within a time period in which pulse signal φ1 is at an "L" level. Switches SW1, SW2 are turned on alternately, and are not turned on simultaneously. Switches SW1, SW2 are turned on/off with an interval which is sufficiently shorter than a time required to detect a ground fault.

In a case where switch SW1 is ON and switch SW2 is OFF, ground fault detection apparatus 10 has the same configuration as that of ground fault detection apparatus 1. In a case where switch SW1 is OFF and switch SW2 is ON, ground fault detection apparatus 10 has the same circuit configuration as that of ground fault detection apparatus 1 except that the U phase and the V phase of ground fault detection apparatus 1 are reversed. In order to detect a ground fault within a predetermined time from when the ground fault occurs, it is only necessary to set a time in which both of switches SW1, SW2 are OFF to be sufficiently shorter than the predetermined time.

Next, an operation of ground fault detection apparatus 10 will be described. A current flowing from V phase wire VL into resistive element RE5 is referred to as I5, a current flowing from neutral wire OL into resistive element RE6 is referred to as I6, and a current flowing from U phase wire UL into resistive element RE7 is referred to as I7. Further, the resistance values of resistive elements RE5 to RE7 are referred to as R5 to R7, respectively. R5 to R7 are set as R5=R6=R7, and each of R5, R6. R7 is, for example, 40 (kΩ).

In a case where no ground fault accident occurs, when switch SW1 is ON, current I5=−I6=Vac2/(R5+R6)=Vac1/(2·R6) flows from V phase wire VL, via switch SW1 and resistive elements RE5, RE6, to neutral wire OL. On this occasion, current Ig is set as Ig=I5+I6=0 (mA). Therefore, |Ig|<ITH is obtained, and ground fault detection signal φD is set to an "L" level as a deactivated level.

Similarly, in the case where no ground fault accident occurs, when switch SW2 is ON, current I7=−I6=Vac1/(R6+R7)=Vac1/(2·R6) flows from U phase wire UL, via switch SW2 and resistive elements RE7, RE6, to neutral wire OL. On this occasion, current Ig is set as Ig=I5+I6=0 (mA). Therefore, |Ig|<ITH is obtained, and ground fault detection signal φD is set to an "L" level as a deactivated level.

In the case where no ground fault accident occurs, when both of switches SW1, SW2 are OFF, no current flows through resistive elements RE5 to RE7, and I5 to I7 and Ig are each 0 (mA). Therefore, |Ig|<ITH is obtained, and ground fault detection signal φD is set to an "L" level as a deactivated level.

FIGS. 16(a) to 16(d) are time charts showing simulation results of temporal changes of currents I5 to I7 and Ig in a case where point Pg in neutral wire OL has a ground fault at a given time. FIGS. 16(e) and 16(f) are time charts showing ON/OFF states of switches SW1, SW2. In a case where switch SW1 is ON, ground fault detection apparatus 10 has the same configuration as that of ground fault detection apparatus 1, and currents I5, I6, Ig change as with currents I1, I2, Ig shown in FIGS. 2(a) and 2(b) and FIGS. 3(a) to 3(c). Since switch SW1 is ON for the predetermined time with the predetermined cycle, and currents I5, I6, Ig flow only when switch SW1 is ON, each of currents I5, I6, Ig also changes in a pulsed manner in response to switch SW1.

In a case where switch SW2 is ON, ground fault detection apparatus 10 has the same configuration as that of ground fault detection apparatus 1 except that the V phase and the U phase are reversed, and currents I6, I7, Ig change as with currents I1, I2, Ig shown in FIGS. 2(a) and 2(b) and FIGS. 3(a) to 3(c). Since switch SW2 is ON for the predetermined time with the predetermined cycle, and currents I6, I7, Ig flow only when switch SW2 is ON, each of currents I6, I7, Ig also changes in a pulsed manner in response to switch SW2.

In a normal state before a ground fault accident occurs, current I5 and current I6 have opposite phases, and current Ig is set as Ig=I5+I6=0 (mA). Further, current I6 and current I7 have opposite phases, and current Ig is set as Ig=I6+I7=0 (mA). When a ground fault occurs at point Pg in neutral wire OL at a given time, current I6 is set as I6=0 (mA) and current Ig is set as Ig=I5=Vac2/RE5 or Ig=I7=Vac1/RE7. Therefore, the absolute value of the instantaneous value of Ig exceeds threshold value ITH, and ground fault detection signal φD is set to an "H" level as an activated level.

FIGS. 17(a) to 17(d) are time charts showing simulation results of temporal changes of currents I5 to I7 and Ig in a case where point Pg in U phase wire UL has a ground fault at a given time. FIGS. 17(e) and 17(f) are time charts showing ON/OFF states of switches SW1, SW2. In a case where switch SW1 is ON, ground fault detection apparatus 10 has the same configuration as that of ground fault detection apparatus 1, and currents I5, I6, Ig change as with currents I1, I2, Ig shown in FIGS. 4(a) and 4(b) and FIGS. 5(a) to 5(c). Since switch SW1 is ON for the predetermined time with the predetermined cycle, and currents I5, I6, Ig flow only when switch SW1 is ON, each of currents I5, I6, Ig also changes in a pulsed manner in response to switch SW1.

In a case where switch SW2 is ON, ground fault detection apparatus 10 has the same configuration as that of ground fault detection apparatus 1 except that the V phase and the U phase are reversed, and currents I6, I7, Ig change as with currents I2, I1, Ig shown in FIGS. 6(a) and 6(b) and FIGS. 7(a) to 7(c). Since switch SW2 is ON for the predetermined time with the predetermined cycle, and currents I6, I7, Ig flow only when switch SW2 is ON, each of currents I6, I7, Ig also changes in a pulsed manner in response to switch SW2.

In a normal state before a ground fault accident occurs, current I5 and current I6 have opposite phases, and current Ig is set as Ig=I5+I6=0 (mA). Further, current I6 and current I7 have opposite phases, and current Ig is set as Ig=I6+I7=0 (mA).

In the case where a ground fault occurs at point Pg in U phase wire UL at a given time, current I7 is set as I7=0 (mA). In addition, when switch SW1 is ON, current Ig is set as Ig=Vac1/R6+(Vac1+Vac2)/R5; when switch SW2 is ON, current Ig is set as Ig=Vac1/R6; and when both of switches SW1, SW2 are OFF, current Ig is set as Ig=Vac1/R6. Therefore, the absolute value of the instantaneous value of Ig exceeds threshold value ITH, and ground fault detection signal φD is set to an "H" level as an activated level.

FIGS. 18(a) to 18(d) are time charts showing simulation results of temporal changes of currents I5 to I7 and Ig in a case where point Pg in V phase wire VL has a ground fault at a given time. FIGS. 18(e) and 18(f) are time charts showing ON/OFF states of switches SW1, SW2. In a case where switch SW1 is ON, ground fault detection apparatus 10 has the same configuration as that of ground fault detection apparatus 1, and currents I5, I6, Ig change as with currents I1, I2, Ig shown in FIGS. 6(a) and 6(b) and FIGS. 7(a) to 7(c). Since switch SW1 is ON for the predetermined time with the predetermined cycle, and currents I5, I6, Ig flow only when switch SW1 is ON, each of currents I5, I6, Ig also changes in a pulsed manner in response to switch SW1.

In a case where switch SW2 is ON, ground fault detection apparatus 10 has the same configuration as that of ground fault detection apparatus 1 except that the V phase and the U phase are reversed, and currents I6, I7, Ig change as with currents I2, I1, Ig shown in FIGS. 4(a) and 4(b) and FIGS. 5(a) to 5(c). Since switch SW2 is ON for the predetermined time with the predetermined cycle, and currents I6, I7, Ig flow only when switch SW2 is ON, each of currents I6, I7, Ig also changes in a pulsed manner in response to switch SW2.

In a normal state before a ground fault accident occurs, current I5 and current I6 have opposite phases, and current Ig is set as Ig=I5+I6=0 (mA). Further, current I6 and current I7 have opposite phases, and current Ig is set as Ig=I6+I7=0 (mA).

When a ground fault occurs at point Pg in V phase wire VL at a given time, current I5 is set as I5=0 (mA). In addition, when switch SW1 is ON, current Ig is set as Ig=Vac2/R6; when switch SW2 is ON, current Ig is set as Ig=Vac1/R6+(Vac1+Vac2)/R7; and when both of switches SW1, SW2 are OFF, current Ig is set as Ig=Vac1/R6. Therefore, the absolute value of the instantaneous value of Ig exceeds threshold value ITH, and ground fault detection signal φD is set to an "H" level as an activated level.

As described above, in Embodiment 1, since current Ig flowing through current detector 2 differs depending on the point where a ground fault occurs, highly accurate current detector 2 capable of detecting even small current Ig is required. In contrast, in Embodiment 3, since switches SW1, SW2 are turned on alternately, current Ig has a high value whenever either one of switches SW1, SW2 is turned on. Therefore, highly accurate current detector 2 is not required, and thus the apparatus can be manufactured at a lower cost.

In addition, when both of switches SW1, SW2 are in an OFF state, no current flows through resistive elements RE5 to RE7. Therefore, power consumption during that period can be reduced, and lower power consumption can be achieved.

Embodiment 4

Figure 19:
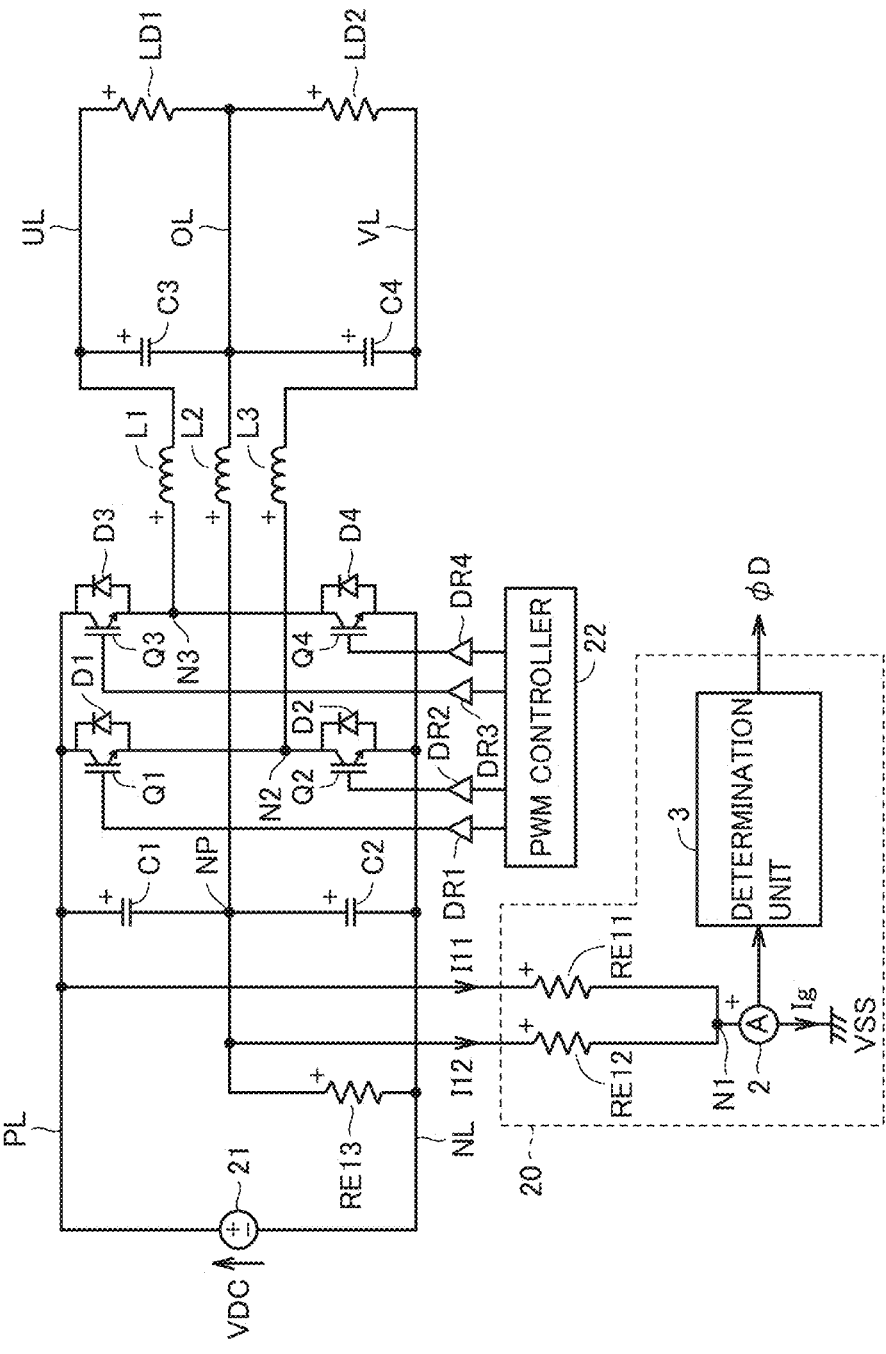
FIG. 19 is a circuit block diagram showing a configuration of a ground fault detection apparatus in accordance with Embodiment 4 of the present invention.

FIG. 19 is a circuit block diagram showing a configuration of a ground fault detection apparatus 20 in accordance with Embodiment 4 of the present invention. In FIG. 19, ground fault detection apparatus 20 is an apparatus detecting a ground fault in an ungrounded AC circuit, and includes resistive elements RE11, RE12, current detector 2, and determination unit 3. The ungrounded AC circuit includes a DC power source 21, a resistive element RE13, capacitors C1 to C4, transistors Q1 to Q4, diodes D1 to D4, drivers DR1 to DR4, a PWM controller 22, reactors L1 to L4, and loads LD1, LD2. The ungrounded AC circuit also includes a positive-side DC bus PL, a negative-side DC bus NL, a DC neutral point NP, U phase wire UL, neutral wire OL, and V phase wire VL.

DC power source 21 outputs a DC voltage VDC between a positive electrode and a negative electrode. Positive-side DC bus PL is connected to the positive electrode of DC power source 21, and negative-side DC bus NL is connected to the negative electrode of DC power source 21. Capacitor C1 is connected between positive-side DC bus PL and DC neutral point NP. Capacitor C2 is connected between DC neutral point NP and negative-side DC bus NL. Capacitors C1, C2 constitute a voltage divider which equally divides DC voltage VDC to set the voltage of DC neutral point NP to VDC/2. Further, capacitors C1, C2 stabilize the DC voltage between positive-side DC bus PL and negative-side DC bus NL. Resistive element RE13 is connected between DC neutral point NP and negative-side DC bus NL, and is provided to adjust the voltage of DC neutral point NP to an intermediate voltage VDC/2 of DC buses PL, NL.

Transistors Q1, Q3 have collectors both connected to positive-side DC bus PL, and emitters connected to output nodes N2, N3, respectively. Transistors Q2, Q4 have collectors connected to output nodes N2, N3, respectively, and emitters both connected to negative-side DC bus NL. Diodes D1 to D4 are connected in antiparallel with transistors Q1 to Q4, respectively.

PWM (Pulse Width Modulation) controller 22 performs PWM control on gate voltages of transistors Q1 to Q4 via drivers DR1 to DR4, and converts the DC voltage between DC buses PL, NL into an AC voltage. That is, transistors Q1 to Q4, diodes D1 to D4, drivers DR1 to DR4, and PWM controller 22 constitute an inverter which converts DC power into AC power.

Figure 20:
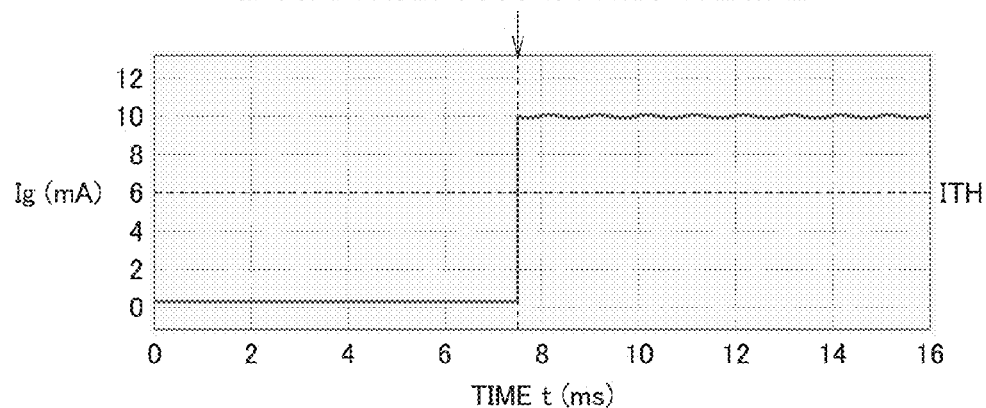
FIG. 20 is a view showing an operation of the ground fault detection apparatus in a case where a neutral wire shown in FIG. 19 has a ground fault.
Figure 21:
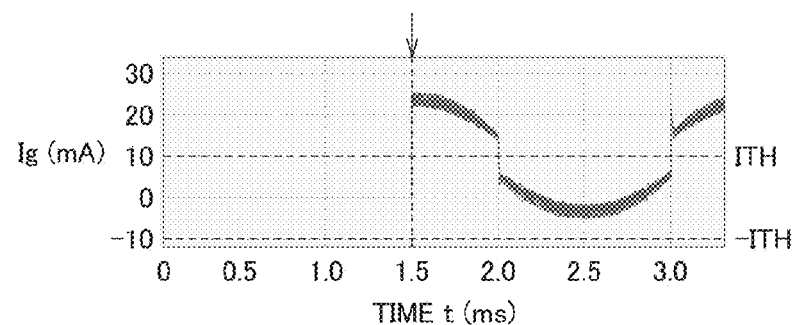
FIG. 21 is a view showing an operation of the ground fault detection apparatus in a case where a U phase wire shown in FIG. 19 has a ground fault.
Figure 22:
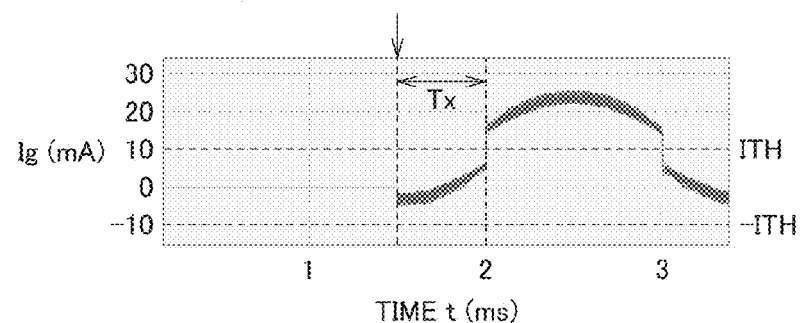
FIG. 22 is a view showing an operation of the ground fault detection apparatus in a case where a V phase wire shown in FIG. 19 has a ground fault.

Reactors L1 to L3 have one terminals connected to output node N3, DC neutral point NP, and output node N2, respectively, and the other terminals connected to one ends of U phase wire UL, neutral wire OL, and V phase wire VL, respectively. Capacitor C3 is connected between the other terminals of reactors L1, L2. Capacitor C4 is connected between the other terminals of reactors L2, L3. Load LD1 is connected between the other end of U phase wire UL and the other end of neutral wire OL. Load LD2 is connected between the other end of neutral wire OL and the other end of V phase wire VL. It is noted that DC neutral point NP and neutral wire OL may be directly connected to each other with reactor L2 being removed. Simulation results in FIGS. 20 to 22 are results obtained when reactor L2 is not provided.

Reactors L1 to L3 and capacitors C3, C4 constitute a low pass filter which passes the AC voltage generated by the inverter to loads LD1, LD2, and prevents switching frequency noise generated in the inverter from being passed to loads LD1, LD2. Further, reactors L1 to L3 and capacitors C3, C4 convert a pulse voltage train generated by the inverter into a sinusoidal AC voltage, and provides it to loads LD1, LD2.

Resistive elements RE11, RE12 of ground fault detection apparatus 20 have an identical resistance value. Resistive elements RE11, RE12 have one terminals connected to positive-side DC bus PL and DC neutral point NP, respectively, and the other terminals connected to each other via node N1. Current detector 2 detects an instantaneous value of current Ig flowing from the other terminals of resistive elements RE11, RE12 (i.e., node N1) to the line of ground voltage VSS (ground point), and provides a signal indicating the detected value to determination unit 3. The line of ground voltage VSS is, for example, an automobile chassis.

Determination unit 3 generates ground fault detection signal φD indicating whether or not a ground fault accident occurs in the ungrounded AC circuit, based on the output signal of current detector 2. In a case where no ground fault accident occurs and thus the absolute value of the instantaneous value of current Ig is lower than predetermined threshold value ITH, ground fault detection signal φD is set to an "L" level, which is a deactivated level. In a case where a ground fault accident occurs and thus the absolute value of the instantaneous value of current Ig exceeds predetermined threshold value ITH, ground fault detection signal φD is set to an "H" level, which is an activated level.

Next, an operation of ground fault detection apparatus 20 will be described. A current flowing from positive-side DC bus PL into resistive element RE11 is referred to as I11, and a current flowing from DC neutral point NP into resistive element RE12 is referred to as I12. Further, the resistance values of resistive elements RE11, RE12 are referred to as R11, R12, respectively. R11, R12 are set as R11=R12, and each of R11, R12 is, for example, 20 (kΩ). It is noted that, when the resistance value of resistive element RE13 is referred to as R13, R13 is set as R13=R11+R12.

In the case where no ground fault accident occurs, current I=I11=−I12=(VDC/2)/(R11+R12)=VDC/(4·R11) flows from positive-side DC bus PL, via resistive elements RE11, RE12, to DC neutral point NP. On this occasion, current Ig is set as Ig=I11+I12=0 (mA). Therefore, |Ig|<ITH is obtained, and ground fault detection signal φD is set to an "L" level as a deactivated level.

FIG. 20 is a time chart showing a simulation result of a temporal change of current Ig in a case where point Pg in neutral wire OL has a ground fault at a given time. In FIG. 20, in a normal state before a ground fault accident occurs, currents I11, I12 flowing through resistive elements RE11, RE12 have opposite polarities, and current Ig is set as Ig=I11+I12=0 (mA).

When a ground fault occurs at point Pg in neutral wire OL at a given time, a low impedance current path is formed between the negative-side terminal of current detector 2 and ground fault point Pg, and a current flows through a path from positive-side DC bus PL, via resistive element RE11, current detector 2, the line of ground voltage VSS, and ground fault point Pg, to neutral wire OL. When the ground fault path has an impedance of 0Ω, the current flowing through current detector 2 is set as Ig=VDC/(2·R11), and the absolute value of the instantaneous value of Ig exceeds threshold value ITH. Determination unit 3 in FIG. 19 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

That is, current Ig having a value up to four times the value of current I11, I12 flowing through resistive element RE11, RE12 under normal operation conditions flows through current detector 2. Since current Ig is normally Ig=0 (mA), in the case where a current having a value exceeding threshold value ITH flows through current detector 2, it can be determined that a ground fault occurs. It is noted that, normally, the current supplied to loads LD1, LD2 is sufficiently larger than Ig=VDC/R11, and thus the current supplied to loads LD1, LD2 does not change even if neutral wire OL has a ground fault, and the ground fault current does not change depending on the magnitude of loads LD1, LD2.

FIG. 21 is a time chart showing a simulation result of a temporal change of current Ig in a case where point Pg in U phase wire UL has a ground fault at a given time. In FIG. 21, in a normal state before a ground fault accident occurs, currents I11, I12 flowing through resistive elements RE11, RE12 have opposite polarities, and current Ig is set as Ig=I11+I12=0 (mA).

When a ground fault occurs at point Pg in U phase wire UL at a given time, a low impedance current path is formed between the negative-side terminal of current detector 2 and ground fault point Pg, and a current flows through a path from positive-side DC bus PL, via resistive element RE11, current detector 2, the line of ground voltage VSS, and ground fault point Pg, to U phase wire UL. When the ground fault path has an impedance of 0Ω, the current flowing through current detector 2 has an average value Ig=VDC/(2·R11). It is noted that the absolute value of Ig may not exceed ITH, depending on the timing of the ground fault. Determination unit 3 in FIG. 19 sets ground fault detection signal φD to an "H" level as an activated level in response to the absolute value of the instantaneous value of Ig exceeding threshold value ITH, and notifies the user of the ungrounded AC circuit of the occurrence of a ground fault accident.

FIG. 22 is a time chart showing a simulation result of a temporal change of current Ig in a case where point Pg in V phase wire VL has a ground fault at a given time. In FIG. 22, in a normal state before a ground fault accident occurs, currents I11, I12 flowing through resistive elements RE11, RE12 have opposite polarities, and current Ig is set as Ig=I11+I12=0 (mA).

When a ground fault occurs at point Pg in V phase wire VL at a given time, a low impedance current path is formed between the negative-side terminal of current detector 2 and ground fault point Pg, and a current flows through a path from positive-side DC bus PL, via resistive element RE11, current detector 2, the line of ground voltage VSS, and ground fault point Pg, to V phase wire VL. When the ground fault path has an impedance of 0Ω, the current flowing through current detector 2 has an average value Ig=VDC/(2·R11). In FIG. 22, current Ig exceeding threshold value ITH does not flow when a ground fault occurs, and the absolute value of current Ig exceeds threshold value ITH after a predetermined time Tx elapses. It is noted that the absolute value of Ig may become considerably high, depending on the timing of the ground fault.

Embodiment 5

Figure 23:
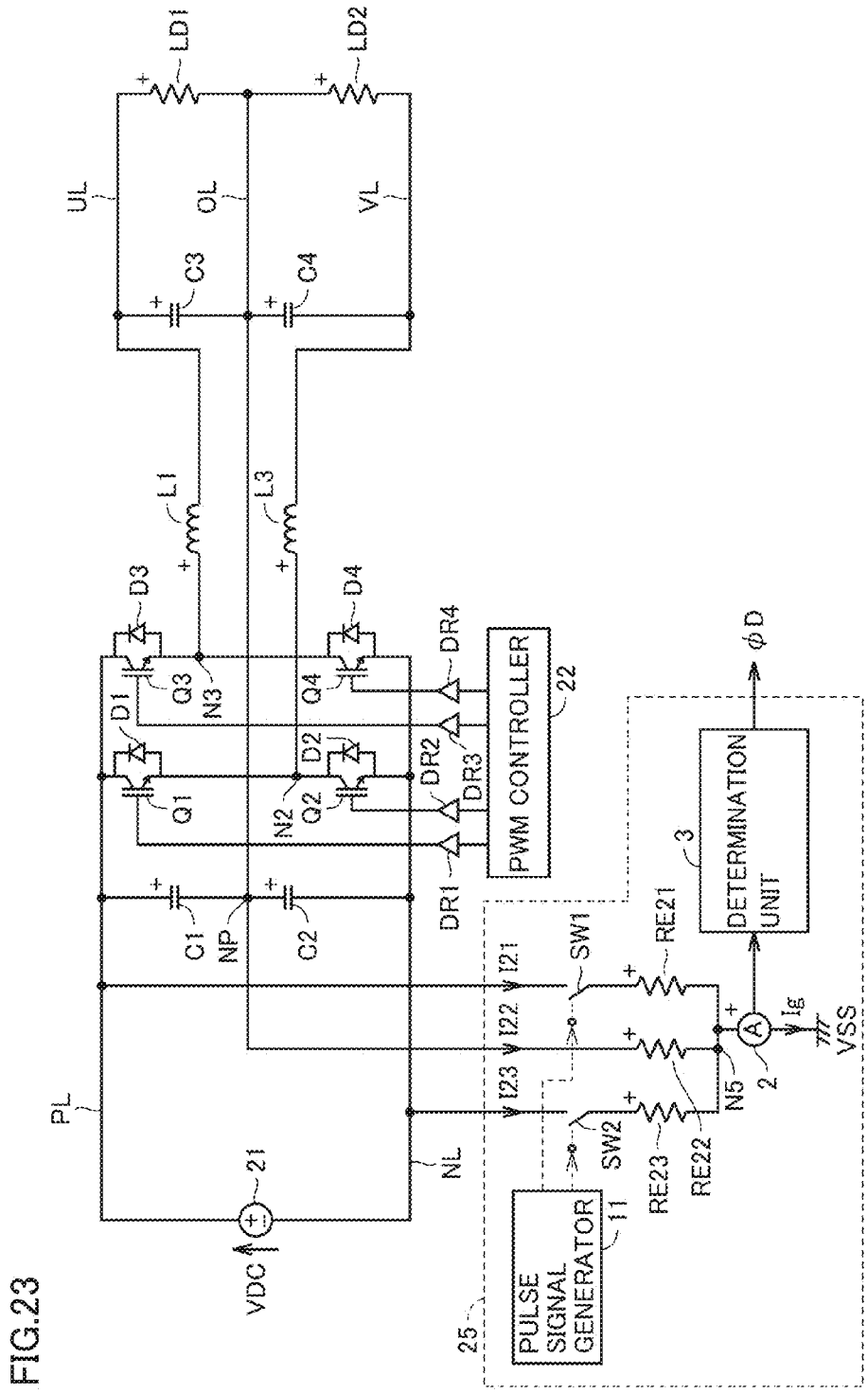
FIG. 23 is a circuit block diagram showing a configuration of a ground fault detection apparatus in accordance with Embodiment 5 of the present invention.
Figure 24:
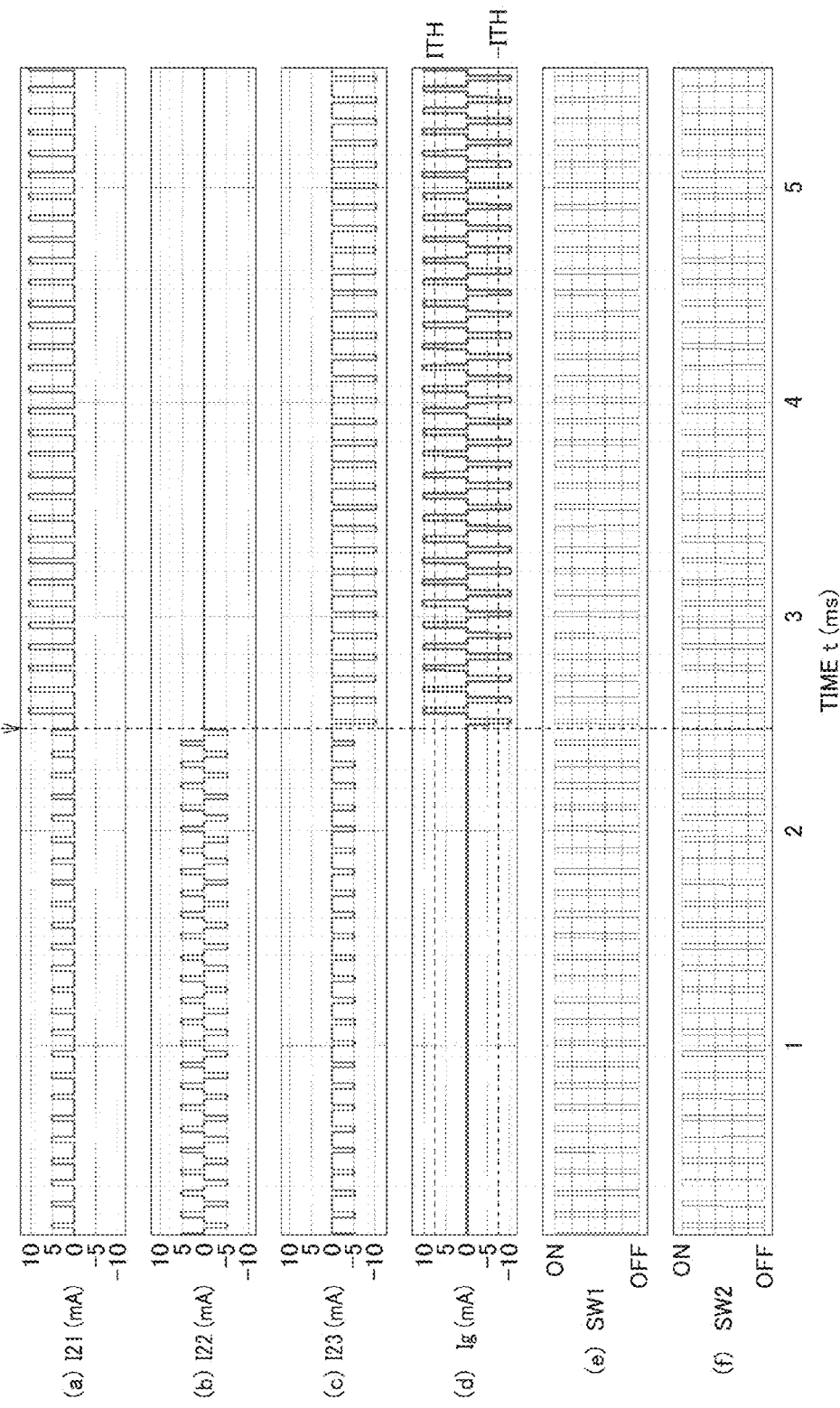
FIG. 24 shows an operation of the ground fault detection apparatus in a case where a neutral wire shown in FIG. 23 has a ground fault.

FIG. 23 is a circuit block diagram showing a configuration of a ground fault detection apparatus 25 in accordance with Embodiment 5 of the present invention, and is a view to be compared with FIG. 19. Referring to FIG. 23, ground fault detection apparatus 25 is different from ground fault detection apparatus 20 in FIG. 19 in that resistive elements RE11, RE12 are replaced by resistive elements RE21 to RE23, and switches SW1, SW2 and pulse signal generator 11 are added.

Switch SW1 is connected in series with resistive element RE21 between positive-side DC bus PL and a node N5. Resistive element RE22 is connected between DC neutral point NP and node N5. Switch SW2 is connected in series with resistive element RE23 between negative-side DC bus NL and node N5. Current detector 2 is connected between node N5 and the line of ground voltage VSS (ground point). Resistive elements RE21 to RE23 have an identical resistance value.

Switches SW1, SW2 are controlled by pulse signals $\phi 1$, $\phi 2$, respectively, from pulse signal generator 11. Switch SW1 is ON when signal $\phi 1$ is at an "H" level, and is OFF when signal $\phi 1$ is at an "L" level. Switch SW2 is ON when signal $\phi 2$ is at an "H" level, and is OFF when signal $\phi 2$ is at an "L" level.

Pulse signal generator 11 sets pulse signal $\phi 1$ to an "H" level for a predetermined time with a predetermined cycle, and sets pulse signal $\phi 2$ to an "H" level for a predetermined time with a predetermined cycle. Pulse signal $\phi 1$ is set to an "H" level for the predetermined time within a time period in which pulse signal $\phi 2$ is at an "L" level, and pulse signal $\phi 2$ is set to an "H" level for the predetermined time within a time period in which pulse signal $\phi 1$ is at an "L" level. Switches SW1, SW2 are turned on alternately, and are not turned on simultaneously. Switches SW1, SW2 are turned on/off with an interval which is sufficiently shorter than a time required to detect a ground fault.

In a case where switch SW1 is ON and switch SW2 is OFF, ground fault detection apparatus 25 has the same configuration as that of ground fault detection apparatus 20. In a case where switch SW1 is OFF and switch SW2 is ON, ground fault detection apparatus 25 has the same circuit configuration as that of ground fault detection apparatus 20 except that positive-side DC bus PL and negative-side DC bus NL of ground fault detection apparatus 20 are reversed. In order to detect a ground fault within a predetermined time from when the ground fault occurs, it is only necessary to set a time in which both of switches SW1, SW2 are OFF to be sufficiently shorter than the predetermined time.

Next, an operation of ground fault detection apparatus 25 will be described. A current flowing from positive-side DC bus PL into resistive element RE21 is referred to as I21, a current flowing from DC neutral point NP into resistive element RE22 is referred to as I22, and a current flowing from negative-side DC bus NL into resistive element RE23 is referred to as I23. Further, the resistance values of resistive elements RE21 to RE23 are referred to as R21 to R23, respectively. R21 to R23 are set as R21=R22=R23, and each of R21, R22, R23 is, for example, 40 (kΩ).

In a case where no ground fault accident occurs, when switch SW1 is ON, current I=I21=−I22=(VDC/2)/(R21+R22)=VDC/(4·R22) flows from positive-side DC bus PL, via switch SW1 and resistive elements RE21, RE22, to DC neutral point NP. On this occasion, current Ig is set as Ig=I21+I22=0 (mA). Therefore, |Ig|<ITH is obtained, and ground fault detection signal $\phi$D is set to an "L" level as a deactivated level.

Similarly, in the case where no ground fault accident occurs, when switch SW2 is ON, current I=I22=−I23=(VDC/2)/(R22+R23)=VDC/(4·R22) flows from DC neutral point NP, via switch SW2 and resistive elements RE22, RE23, to negative-side DC bus NL. On this occasion, current Ig is set as Ig=I22+I23=0 (mA). Therefore, |Ig|<ITH is obtained, and ground fault detection signal $\phi$D is set to an "L" level as a deactivated level.

In the case where no ground fault accident occurs, when both of switches SW1, SW2 are OFF, no current flows through resistive elements RE21 to RE23, and I21 to I23 and Ig are each 0 (mA). Therefore, |Ig|<ITH is obtained, and ground fault detection signal $\phi$D is set to an "L" level as a deactivated level.

FIGS. 24(a) to 24(d) are time charts showing simulation results of temporal changes of currents I21 to I23 and Ig in a case where point Pg in neutral wire OL has a ground fault at a given time. FIGS. 24(e) and 24(f) are time charts showing ON/OFF states of switches SW1, SW2. In a case where switch SW1 is ON, ground fault detection apparatus 25 has the same configuration as that of ground fault detection apparatus 20. Since switch SW1 is ON for the predetermined time with the predetermined cycle, and currents I21, I22, Ig flow only when switch SW1 is ON, each of currents I21, I22, Ig also changes in a pulsed manner in response to switch SW1.

In a case where switch SW2 is ON, ground fault detection apparatus 25 has the same configuration as that of ground fault detection apparatus 20 except that positive-side DC bus PL and negative-side DC bus NL are reversed. Since switch SW2 is ON for the predetermined time with the predetermined cycle, and currents I22, I23, Ig flow only when switch SW2 is ON, each of currents I22, I23, Ig also changes in a pulsed manner in response to switch SW2.

In a normal state before a ground fault accident occurs, current I21 and current I22 have opposite polarities, and current Ig is set as Ig=I21+I22=0 (mA). Further, current I22 and current I23 have opposite polarities, and current Ig is set as Ig=I22+I23=0 (mA). When a ground fault occurs at point Pg in neutral wire OL at a given time, current I22 is set as I22=0 (mA) and current Ig is set as Ig=I21=VDC/(2·R21) or Ig=−I23=−VDC/(2·R23). Therefore, the absolute value of the instantaneous value of Ig exceeds threshold value ITH, and ground fault detection signal $\phi$D is set to an "H" level as an activated level.

FIGS. 25(a) to 25(d) are time charts showing simulation results of temporal changes of currents I21 to I23 and Ig in a case where point Pg in U phase wire UL has a ground fault at a given time. FIGS. 25(e) and 25(f) are time charts showing ON/OFF states of switches SW1, SW2.

In a normal state before a ground fault accident occurs, current I21 and current I22 have opposite polarities, and current Ig is set as Ig=I21+I22=0 (mA). Further, current I22 and current I23 have opposite polarities, and current Ig is set as Ig=I22+I23=0 (mA). Therefore, the absolute value of the instantaneous value of Ig is lower than threshold value ITH, and ground fault detection signal $\phi$D is set to an "L" level as a deactivated level.

In the case where a ground fault occurs at point Pg in U phase wire UL at a given time, when switch SW1 is ON, Ig has an average value of VDC/(2·R21); when switch SW2 is ON, Ig has an average value of −VDC/(2·R23); and when both of switches SW1, SW2 are OFF, Ig has an average value of 0. Therefore, the absolute value of the instantaneous value of Ig exceeds threshold value ITH, and ground fault detection signal φD is set to an "H" level as an activated level.

FIGS. 26(a) to 26(d) are time charts showing simulation results of temporal changes of currents I21 to I23 and Ig in a case where point Pg in V phase wire VL has a ground fault at a given time. FIGS. 26(e) and 26(f) are time charts showing ON/OFF states of switches SW1, SW2.

In a normal state before a ground fault accident occurs, current I21 and current I22 have opposite polarities, and current Ig is set as Ig=I21+I22=0 (mA). Further, current I22 and current I23 have opposite polarities, and current Ig is set as Ig=I22+I23=0 (mA). Therefore, the absolute value of the instantaneous value of Ig is lower than threshold value ITH, and ground fault detection signal φD is set to an "L" level as a deactivated level.

In the case where a ground fault occurs at point Pg in V phase wire VL at a given time, when switch SW1 is ON, Ig has an average value of −VDC/(2·R21); when switch SW2 is ON, Ig has an average value of VDC/(2·R23); and when both of switches SW1, SW2 are OFF, Ig has an average value of 0. Therefore, the absolute value of the instantaneous value of Ig exceeds threshold value ITH, and ground fault detection signal φD is set to an "H" level as an activated level.

As described above, in Embodiment 4, time Tx is required from when a ground fault occurs to when the ground fault is determined, and a longer time may be required to detect a ground fault, depending on when the ground fault occurs. In contrast, in Embodiment 5, a ground fault can be detected in a short time determined by on/off times of switches SW1, SW2.

In addition, when both of switches SW1, SW2 are in an OFF state, no current flows through resistive elements RE21 to RE23. Therefore, power consumption during that period can be reduced, and lower power consumption can be achieved.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A ground fault detection apparatus detecting a ground fault in an ungrounded AC circuit in which a single-phase three-wire AC power source is connected to a load via a first phase wire, a neutral wire, and a second phase wire, comprising:
a first resistive element, a second resistive element, and a third resistive element, one terminal of the first resistive element being connected to the first phase wire, one terminal of the second resistive element being connected to the neutral wire, one terminal of the third resistive element being connected to the second phase wire, the other terminal of the first resistive element, the other terminal of the second resistive element, and the other terminal of the third resistive element being connected to each other via a node, the first resistive element and the second resistive element having an identical resistance value; and
a first switching element and a second switching element which are turned on alternately, the first switching element being connected in series with the first resistive element between the first phase wire and the node, and the second switching element being connected in series with the third resistive element between the second phase wire and the node;
a current detector detecting a value of a current flowing between the node and a ground point,
wherein, in a case where the value detected by the current detector exceeds a predetermined threshold value, the ground fault detection apparatus determines that the ground fault occurs.

2. The ground fault detection apparatus according to claim 1, wherein the third resistive element has a resistance value identical to those of the first resistive element and the second resistive element.

3. A ground fault detection apparatus detecting a ground fault in an ungrounded AC circuit in which a single-phase three-wire AC power source is connected to a load via a first phase wire, a neutral wire, and a second phase wire,
said single-phase three-wire AC power source including
an inverter converting DC power supplied from a DC power source via a positive-side DC bus and a negative-side DC bus into AC power, and supplying the AC power to said load via said first phase wire and said second phase wire, and
a voltage divider generating an intermediate voltage of said positive-side DC bus and said negative-side DC bus and providing the intermediate voltage to said neutral wire,
said ground fault detection apparatus comprising:
a first resistive element and a second resistive element, one terminal of said first resistive element being connected to said positive-side DC bus or said negative-side DC bus, one terminal of said second resistive element receiving said intermediate voltage, the other terminal of said first resistive element and the other terminal of said second resistive element being connected to each other via a node; and
a current detector detecting a value of a current flowing between said node and a ground point,
wherein, in a case where the value detected by said current detector exceeds a predetermined threshold value, said ground fault detection apparatus determines that said ground fault occurs.

4. The ground fault detection apparatus according to claim 3, wherein said first resistive element and said second resistive element have an identical resistance value.

5. The ground fault detection apparatus according to claim 4, further comprising a third resistive element, and a first switching element and a second switching element,
wherein one terminal of said first resistive element is connected to said positive-side DC bus,
one terminal of said third resistive element is connected to said negative-side DC bus,
the other terminal of said third resistive element is connected to the other terminal of said first resistive element and the other terminal of said second resistive element via said node,
said first switching element is connected in series with said first resistive element between said positive-side DC bus and said node, and
said second switching element is connected in series with said third resistive element between said negative-side DC bus and said node.

6. The ground fault detection apparatus according to claim 5, wherein said third resistive element has a resistance value identical to those of said first resistive element and said second resistive element.

* * * * *